(12) United States Patent
Matsumoto et al.

(10) Patent No.: US 10,074,818 B2
(45) Date of Patent: Sep. 11, 2018

(54) TRANSISTOR

(71) Applicants: Toppan Forms Co., Ltd., Tokyo (JP); Osaka University, Osaka (JP); The University of Tokyo, Tokyo (JP)

(72) Inventors: Takafumi Matsumoto, Tokyo (JP); Junichi Takeya, Suita (JP)

(73) Assignees: TOPPAN FORMS CO., LTD., Tokyo (JP); OSAKA UNIVERSITY, Osaka (JP); THE UNIVERSITY OF TOKYO, Tokyo (JP)

( * ) Notice: Subject to any disclaimer, the term of this patent is extended or adjusted under 35 U.S.C. 154(b) by 0 days.

(21) Appl. No.: 14/906,000

(22) PCT Filed: Jul. 9, 2014

(86) PCT No.: PCT/JP2014/068316
§ 371 (c)(1),
(2) Date: Jan. 19, 2016

(87) PCT Pub. No.: WO2015/012107
PCT Pub. Date: Jan. 29, 2015

(65) Prior Publication Data
US 2016/0155969 A1  Jun. 2, 2016

(30) Foreign Application Priority Data

Jul. 23, 2013 (JP) .................................. 2013-152669
Mar. 18, 2014 (JP) .................................. 2014-055595

(51) Int. Cl.
*H01L 51/05* (2006.01)
*H01L 51/00* (2006.01)
*H01L 51/10* (2006.01)

(52) U.S. Cl.
CPC ........ *H01L 51/055* (2013.01); *H01L 51/0091* (2013.01); *H01L 51/0545* (2013.01); *H01L 51/105* (2013.01)

(58) Field of Classification Search
None
See application file for complete search history.

(56) References Cited

U.S. PATENT DOCUMENTS

2007/0235724 A1  10/2007  Wu et al.
2009/0209693 A1*  8/2009  Suganuma .............. C07C 51/00
                                                            524/440
2012/0193618 A1   8/2012  Takeya et al.

FOREIGN PATENT DOCUMENTS

CN       1768437 A        5/2006
CN     101050268 A       10/2007
(Continued)

OTHER PUBLICATIONS

Kim, Jinwoo, Junhee Cho, Seungjun Chung, Jeonghun Kwak, Changhee Lee, Jang-Joo Kim, and Yongtaek Hong. "Inkjet-Printed Silver Gate Electrode and Organic Dielectric Materials for Bottom-Gate Pentacene Thin-Film Transistors." Journal of the Korean Physical Society 54.925 (2009): 518.*

(Continued)

*Primary Examiner* — Joseph Schoenholtz
(74) *Attorney, Agent, or Firm* — Hoffman & Baron, LLP

(57) ABSTRACT

The transistor includes a gate electrode, an insulating layer, a semiconductor layer, a source electrode, and a drain electrode on a substrate, in which the gate electrode is formed by using silver β-ketocarboxylate denoted by General Formula (1) described below.

(Continued)

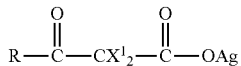

(1)

4 Claims, 25 Drawing Sheets

(56) References Cited

FOREIGN PATENT DOCUMENTS

| JP | 2003347042 A | | 12/2003 |
|---|---|---|---|
| JP | 2004063975 A | | 2/2004 |
| JP | 2007277552 A | | 10/2007 |
| JP | 2009114232 A | * | 5/2009 |
| JP | 2009197133 A | * | 9/2009 |
| JP | 2010238869 A | | 10/2010 |
| JP | 2013040124 A | | 2/2013 |
| TW | 200840108 A | | 10/2008 |
| WO | WO2011040155 A1 | | 4/2011 |

OTHER PUBLICATIONS

'Conductive Pastes' downloaded from URL< http://harimatec.com/products/conductive-paste/> on Apr. 1, 2017.*

Silver Ink Product Brochure downloaded from URL < https://www.harima.co.jp/en/products/electronics/pdf/brochure16e_23.pdf> on Apr. 1.*

Kim, Sun Il, et al. "High Performance Oxide Thin Film Transistors with Double Active Layers." 2008 IEEE International Electron Devices Meeting, 2008, doi:10.1109/iedm.2008.4796617.*

Kim, Jinwoo, Junhee Cho, Seungjun Chung, Jeonghun Kwak, Changhee Lee, Jang-Joo Kim, and Yongtaek Hong, "Inkjet-Printed Silver Gate Electrode and Organic Dielectric Materials for Bottom-Gate Pentacene Thin-Film Transistors." Journal of the Korean Physical Society 54.925 (2009): 518.*

Machine translation of JP 2009-114323.*

Perkinson, J., "Organic Field-Effect Transistors", Nov. 19, 2007, downloaded from URL<http://web.mit.edu/~joyp/Public/OFET%20Term%20Paper.pdf> on Oct. 18, 2017.*

Toppan Forms Press Release "World's First Printed Electronic Tag that Transmits Unique Identification Signal" Jan. 27, 2014, downloaded from URL< http://www.toppan-f.co.jp/english/news/2014/0127.html> on Feb. 9, 2018.*

International Search Report for PCT/JP2014/068316 with translation.

Search Report for corresponding Chinese Application No. 201480041463.0, pp. 1-8, dated Jun. 1, 2017.

Office Action from corresponding Taiwan Application No. 103124764, pp. 1-12, dated Jun. 20, 2017.

* cited by examiner

TRANSISTOR

TECHNICAL FIELD

The present invention relates to a novel transistor having high mobility of a carrier.

Priority is claimed on Japanese Patent Application No. 2013-152669, filed Jul. 23, 2013, and Japanese Patent Application No. 2014-055595, filed Mar. 18, 2014, the contents of which are incorporated herein by reference.

BACKGROUND ART

A transistor has been used in a wide range of fields such as an electronic circuit of a computer or the like, or an IC of a thin film transistor (TFT) and Radio Frequency Identification (RFID).

In general, a transistor is configured by including a gate electrode, an insulating layer, a semiconductor layer, a source electrode, and a drain electrode on a substrate, and recently, an organic transistor including a semiconductor layer (an organic semiconductor layer) formed of an organic material has been developed. The organic transistor can be manufactured through steps which are simplified by a flexible circuit by using the characteristics of the organic material in that the organic material has flexibility and can be laminated by various printing methods, various coating methods, or the like which can be applied under the atmosphere rather than under vacuum, and thus has high usefulness.

One of the important indices for comparing the performance of transistors includes the mobility of a carrier. In the transistor, when a voltage is applied to the gate electrode, carriers are generated in the vicinity of a boundary surface between the semiconductor layer and the insulating layer, and electrical conductivity increases, and when a voltage is applied between the source electrode and the drain electrode, the carriers are moved to the source electrode or the drain electrode, and a current flows. At this time, when the mobility of the carrier is high, in the transistor, an operation from ON to OFF or an operation from OFF to ON is performed quickly, and a current value also increases. Therefore, preferred properties of the carrier are high mobility.

On the other hand, in a bottom gate type transistor including a gate electrode on the substrate side (a lower side) from the semiconductor layer, when surface smoothness of the insulating layer is low (concavities and convexities are large), carriers are moved along the boundary surface in the vicinity of the boundary surface between the semiconductor layer and the insulating layer, and the actual movement distance of the carrier is affected by the concavities and convexities on the surface of the insulating layer. Therefore, the actual movement distance becomes longer than in a case where the concavities and convexities are small (the smoothness is high), and thus the movement speed of the carrier, that is, the mobility decreases. Therefore, in such a transistor, it is important to increase the surface smoothness of the insulating layer.

In response, a method is disclosed in which a coated film is formed by using a photocurable resin, and then an insulating layer is formed by curing the resin due to light irradiation in a state where a glass plate or the like having high surface smoothness is placed on the coated film, and the glass plate or the like is removed, as a method for increasing the surface smoothness of the insulating layer (refer to PTL 1). In addition, a method is disclosed in which a smoothing layer is formed on an insulating layer, and an organic semiconductor layer is formed on the smoothing layer, as a method for lessening an influence of the smoothness of the insulating layer surface (refer to PTL 2).

However, in the method disclosed in PTL 1, it is necessary to arrange and remove the glass plate or the like, and in the method disclosed in PTL 2, it is necessary to form the smoothing layer, and thus in both of the methods, there is a problem in that a manufacturing step of the transistor is complicated.

Originally, the surface smoothness of the insulating layer is affected by the surface of the gate electrode which is arranged on the insulating layer to be in contact with the insulating layer, and when the surface smoothness of the gate electrode is low (the concavities and convexities are large), the surface smoothness of the insulating layer also decreases according to the surface smoothness of the gate electrode. In response, neither of the methods disclosed in PTL 1 and PTL 2 can fundamentally solve the problem at the time of forming the gate electrode through the simplified steps. This is because, when the gate electrode is formed by a method such as vacuum deposition or sputtering, it is possible to increase the surface smoothness, but since a special device is required, the steps become complicated, and the cost increases, and when the gate electrode is formed by various printing methods, various coating methods, or the like, as in the semiconductor layer described above, the gate electrode is formed under the atmosphere, and the gate electrode can be manufactured at a lower cost by more simplified steps, but the surface smoothness decreases.

CITATION LIST

Patent Literature

[PTL 1] Japanese Unexamined Patent Application, First Publication No. 2004-063975
[PTL 2] Japanese Unexamined Patent Application, First Publication No. 2010-238869

SUMMARY OF INVENTION

Technical Problem

An object of the present invention is to provide a transistor including a gate electrode which has high surface smoothness and can be formed through simplified steps.

Solution to Problem

According to the present invention, a transistor is provided including a gate electrode, an insulating layer, a semiconductor layer, a source electrode, and a drain electrode on a substrate, in which the gate electrode is formed by using silver β-ketocarboxylate denoted by General Formula (1) described below.

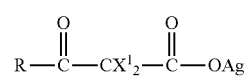

(1)

(In the formula, R represents an aliphatic hydrocarbon group having 1 to 20 carbon atoms or a phenyl group in which one or more hydrogen atoms may be substituted with a substituent group, a hydroxyl group, an amino group, or a group denoted by a general formula "$R^1-CY^1_2-$", "CY$^1_3$—", "R$^1$—CHY$^1$—", "R$_2$O—", "R$^5$R$^4$N—", "(R$^3$O)$_2$CY$^1$—", or "R$^6$—C(=O)—CY$^1_2$—";

Y$^1$s each independently represents a fluorine atom, a chlorine atom, a bromine atom, or a hydrogen atom; R$^1$ represents an aliphatic hydrocarbon group having 1 to 19 carbon atoms or a phenyl group; R$^2$ represents an aliphatic hydrocarbon group having 1 to 20 carbon atoms; R$^3$ represents an aliphatic hydrocarbon group having 1 to 16 carbon atoms; R$^4$ and R$^5$ each independently represents an aliphatic hydrocarbon group having 1 to 18 carbon atoms; R$^6$ represents an aliphatic hydrocarbon group having 1 to 19 carbon atoms, a hydroxyl group, or a group denoted by a formula "AgO—";

X$^1$s each independently represents a hydrogen atom, an aliphatic hydrocarbon group having 1 to 20 carbon atoms, a halogen atom, a phenyl group or a benzyl group in which one or more hydrogen atoms may be substituted with a substituent group, a cyano group, a N-phthaloyl-3-aminopropyl group, a 2-ethoxyvinyl group, or a group denoted by a general formula "R$^7$O—", "R$^7$S—", "R$^7$—C(=O)—", or "R$^7$—C(=O)—O—"; and R$^7$ represents an aliphatic hydrocarbon group having 1 to 10 carbon atoms, a thienyl group, or a phenyl group or a diphenyl group in which one or more hydrogen atoms may be substituted with a substituent group.)

In the transistor of the present invention, the transistor may have a bottom gate and bottom contact type structure or a bottom gate and top contact type structure.

In the transistor of the present invention, surface roughness of the gate electrode based on "ISO4287:1997" may be 1 nm to 10 nm.

In the transistor of the present invention, a thickness of the gate electrode may be 10 nm to 1000 nm, and a thickness of the insulating layer may be 10 nm to 1000 nm.

Advantageous Effects of Invention

In the transistor of the present invention, the gate electrode has high surface smoothness and can be formed through simplified steps.

DESCRIPTION OF EMBODIMENTS

Figure 1:
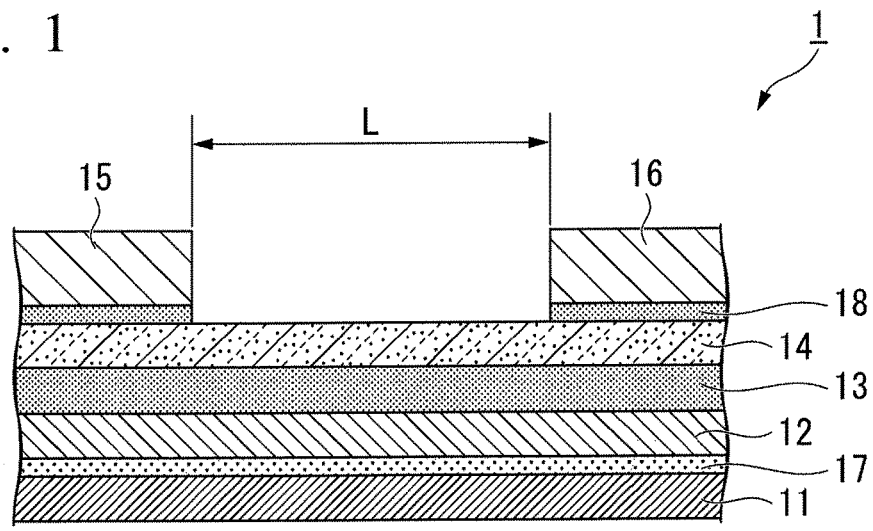
FIG. 1 is a schematic sectional view illustrating an example of a transistor according to the present invention.

Hereinafter, preferred examples of a transistor of the present invention will be described. However, the present invention is not limited to these examples, and for example, addition, omission, substitution, and other modifications (the amount, number, position, size, or the like) can be performed within a range not departing from the gist of the present invention.

<<Transistor>>

A transistor according to the present invention includes a gate electrode, an insulating layer, a semiconductor layer, a source electrode, and a drain electrode on a substrate, in which the gate electrode is formed by using silver β-ketocarboxylate denoted by General Formula (1) described below (hereinafter, simply referred to as "silver β-ketocarboxylate (1)").

By using the silver β-ketocarboxylate (1), the gate electrode can be formed through simplified steps by various printing methods, various coating methods, or the like which can be performed under the atmosphere, unlike vacuum deposition, sputtering, or the like which is necessary to be performed under vacuum. Further, by using the silver β-ketocarboxylate (1), surface smoothness of the gate electrode is high, and thus the transistor has high mobility of a carrier. In addition, the surface smoothness of the gate electrode is high, and thus even when the insulating layer is sufficiently thinned, it is possible to arbitrarily set the thickness without decreasing the surface smoothness.

(1)

(In the formula, R represents an aliphatic hydrocarbon group having 1 to 20 carbon atoms or a phenyl group in which one or more hydrogen atoms may be substituted with a substituent group, a hydroxyl group, an amino group, or a group denoted by a general formula "$R^1$—$CY^1_2$—", "$CY^1_3$—", "$R^1$—$CHY^1$—", "$R_2O$—", "$R^5R^4N$—", "$(R^3O)_2 CY^1$—", or "$R^6$—C(=O)—$CY^1_2$—";

$Y^1$s each independently represents a fluorine atom, a chlorine atom, a bromine atom, or a hydrogen atom; $R^1$ represents an aliphatic hydrocarbon group having 1 to 19 carbon atoms or a phenyl group; $R^2$ represents an aliphatic hydrocarbon group having 1 to 20 carbon atoms; $R^3$ represents an aliphatic hydrocarbon group having 1 to 16 carbon atoms; $R^4$ and $R^5$ each independently represents an aliphatic hydrocarbon group having 1 to 18 carbon atoms; $R^6$ represents an aliphatic hydrocarbon group having 1 to 19 carbon atoms, a hydroxyl group, or a group denoted by a formula "AgO—";

$X^1$s each independently represents a hydrogen atom, an aliphatic hydrocarbon group having 1 to 20 carbon atoms, a halogen atom, a phenyl group or a benzyl group in which one or more hydrogen atoms may be substituted with a substituent group, a cyano group, a N-phthaloyl-3-aminopropyl group, a 2-ethoxyvinyl group, or a group denoted by a general formula "$R^7O$—", "$R^7S$—", "$R^7$—C(=O)—", or "$R^7$—C(=O)—O—"; and $R^7$ represents an aliphatic hydrocarbon group having 1 to 10 carbon atoms, a thienyl group, or a phenyl group or a diphenyl group in which one or more hydrogen atoms may be substituted with a substituent group.)

The transistor according to the present invention can have the same configuration as that of the transistor of the related art except that the gate electrode formed by using the silver β-ketocarboxylate (1) is included as a gate electrode.

FIG. 1 is a schematic sectional view illustrating an example of the transistor according to the present invention.

A transistor 1 illustrated herein has a bottom gate and top contact type structure, includes a gate electrode 12, an insulating layer 13, and a semiconductor layer 14 on a substrate 11 in this order, and includes a source electrode 15 and a drain electrode 16 on the semiconductor layer 14 to face each other. In addition, the gate electrode 12 is disposed on the substrate 11 through a modification layer 17, the modification layer 17 is disposed on one entire main surface (an upper surface) of the substrate 11, and the gate electrode 12 is disposed on one entire main surface (an upper surface) of the modification layer 17. Then, the source electrode 15 and the drain electrode 16 are respectively disposed on the semiconductor layer 14 through an intermediate layer 18, and the intermediate layer 18 is disposed only in a region where the source electrode 15 and the drain electrode 16 on the semiconductor layer 14 exist.

Known substrates such as a substrate having a two-layer structure in which an insulating layer formed of silicon dioxide is formed in a surface portion of a silicon layer doped with impurities (the silicon insulating layer side becomes a side on which the gate electrode 12 is formed), a substrate formed of glass, and a substrate formed of a resin can be exemplified as the substrate 11. In addition, it is preferable that the substrate 11 have high surface smoothness.

It is preferable that the thickness of the substrate 11 be 10 μm to 5 mm.

The gate electrode 12 is formed by using the silver β-ketocarboxylate (1), and contains a material formed of metal silver or metal silver as a main component. Here, "containing metal silver as a main component" indicates that a ratio of the metal silver is sufficiently high to the extent of regarding the gate electrode 12 as a gate electrode which is apparently formed of only the metal silver. For example, the ratio of the metal silver is preferably greater than or equal to 95 mass %, is more preferably greater than or equal to 97 mass %, and is particularly preferably greater than or equal to 99 mass %. In addition, the upper limit value of the ratio of the metal silver, for example, can be selected from any one of 100 mass %, 99.9 mass %, 99.8 mass %, 99.7 mass %, 99.6 mass %, 99.5 mass %, 99.4 mass %, 99.3 mass %, 99.2 mass %, and 99.1 mass %.

It is preferable that the thickness of the gate electrode 12 be 10 nm to 1000 nm.

The gate electrode 12 is formed by using the silver β-ketocarboxylate (1), and thus the surface smoothness is high, and the surface roughness is preferably less than or equal to 10 nm, and is more preferably less than or equal to 5 nm. In addition, for example, 1 nm can be selected as the lower limit value of the surface roughness of the gate electrode 12. Here, the "surface roughness" based on JIS B0601:2001 (ISO4287:1997), indicates arithmetic mean roughness (Ra), and indicates a value which is obtained by Expression (II) described below when only a reference length of 1 is subtracted from a roughness curve in a direction of an average line, an X axis is set in the direction of the average line of the subtracted portion, a Y axis is set in a direction of longitudinal magnification, and the roughness curve is denoted by y=Z(x) in nanometer (nm) unit.

$$Ra = \frac{1}{\ell}\int_0^\ell |Z(x)|\,dx \quad \text{(II)}$$

As illustrated herein, it is preferable that the gate electrode 12 be disposed on the substrate 11 through the modification layer 17 according to the material of the substrate 11, and for example, it is possible to improve adhesiveness of the gate electrode 12 to the substrate 11 by selecting a material containing a component suitable as the modification layer 17.

It is preferable that the thickness of the modification layer 17 be 0.1 nm to 100 nm.

A modification layer formed by using a silane coupling agent can be exemplified as the modification layer 17 which functions as an adhesive layer, and it is preferable that the modification layer be a self-assembling monomolecular film.

A material denoted by general formula "$(R^{101}O)_3SiCH_2(CH_2)_rCH_2NR^{201}R^{301}$ (In the formula, r represents 1 or 8; $R^{101}$ represents an alkyl group, three $R^{101}$s may be identical to each other or different from each other; $R^{201}$ and $R^{301}$ each independently represents a hydrogen atom, an alkyl group, or an aryl group.)" can be exemplified as the silane coupling agent (for example, refer to Japanese Unexamined Patent Application, First Publication No. 2013-040124).

In the formula, r represents 1 or 8.

$R^{101}$ represents an alkyl group, the alkyl group may be any one of a straight-chain alkyl group, a branched-chain alkyl group, and a cyclic alkyl group, and among them, the straight-chain alkyl group or the branched-chain alkyl group is preferable, and an alkyl group having 1 to 5 carbon atoms is preferable. Three $R^{101}$s may be identical to each other or different from each other.

$R^{201}$ and $R^{301}$ each independently represents a hydrogen atom, an alkyl group, or an aryl group.

The alkyl group in $R^{201}$ and $R^{301}$ may be any one of a straight-chain alkyl group, a branched-chain alkyl group, and a cyclic alkyl group, and among them, the straight-chain alkyl group or the branched-chain alkyl group is preferable, and an alkyl group having 1 to 10 carbon atoms is preferable.

The aryl group in $R^{201}$ and $R^{301}$ may be either a monocyclic aryl group or a polycyclic aryl group, an aryl group having 1 to 12 carbon atoms is preferable, and a monocyclic aryl group such as a phenyl group is preferable.

As preferred examples of the silane coupling agent,
(a) a material in which $R^{101}$ represents a methyl group or an ethyl group, $R^{201}$ represents a hydrogen atom, and $R^{301}$ represents a hydrogen atom, a methyl group, an ethyl group, a hexyl group, or an aryl group,
(b) a material in which $R^{101}$ represents a methyl group or an ethyl group, both of $R^{201}$ and $R^{301}$ represent a methyl group, an ethyl group, a hexyl group, or an aryl group, and
(c) a material in which $R^{101}$ represents a methyl group or an ethyl group, $R^{201}$ and $R^{301}$ each independently represents a methyl group, an ethyl group, a hexyl group, or an aryl group, and $R^{201}$ and $R^{301}$ may not be identical to each other
can be exemplified, and as more preferred examples, specifically, a material denoted by a formula "$(CH_3CH_2O)_3SiCH_2(CH_2)_8CH_2N(CH_3)_2$", a material denoted by a formula "$(CH_3O)_3SiCH_2CH_2CH_2N(C_6H_5)_2$", a material denoted by a formula "$(CH_2CH_2O)_3SiCH_2(CH_2)_8CH_2NHC_6H_5$", a material denoted by a formula "$(CH_3CH_2O)_3SiCH_2(CH_2)_8CH_2N(C_6H_5)_2$", and a material denoted by a formula "$(CH_3O)_3SiCH_2CH_2CH_2NH_2$"
can be exemplified.

Known materials such as an inorganic compound such as silicon oxide, silicon nitride, and aluminum oxide; and an organic compound such as a benzocyclobutene-based thermosetting resin, a polyimide-based thermosetting resin, and a polyolefin-based thermosetting resin can be exemplified as the material of the insulating layer (a gate insulating film) 13.

The insulating layer 13 may be formed of one type of material, or may be formed of two or more types of materials, and when the insulating layer 13 is formed of two or more types of materials, the combination and the ratio of the materials can be arbitrarily adjusted.

It is preferable that the thickness of the insulating layer 13 be 10 nm to 1000 nm.

The material of the semiconductor layer 14 may be either an organic semiconductor or a compound semiconductor in which two or more atoms are bonded by ion bonding, and according to the purpose, the material of the semiconductor layer 14 may be suitably selected from known materials.

Gallium nitride (GaN), gallium arsenide (GaAs), zinc oxide (ZnO), tin oxide (SnO$_2$), indium gallium zinc oxide (IGZO), and the like can be exemplified as the material of the compound semiconductor.

A low-molecular-weight material such as rubrene, dinaphtho[2,3-b:2',3'-f]thieno[3,2-b]thiophene (DNTT), alkyl-DNTT, 6,13-Bis(triisopropylsilylethynyl)pentacene (TIPS pentacene), dinaphtho[2,3-d:2',3'-d']benzo[1,2-b:4,5-b']dithiophene (DNBDT), alkyl-DNBDT, and PDIF-CN$_2$; a high-molecular-weight material such as poly[2,5-bis(3-alkylthiophen-2-yl)thieno(3,2-b)thiophene] (pBTTT), poly(dialkylthieno[3,2-b]thiophene-co-bithiophene) (pDA2T), poly (3-hexylthiophene) (P3HT), and poly[5,5'-bis(3-alkyl-2-thienyl)-2,2'-bithiophene] (PQT); a carbon material such as graphene, multilayer graphene, carbon nanotube (CNT), and fullerene (C$_{60}$), and the like can be exemplified as the material of the organic semiconductor.

It is preferable that the thickness of the semiconductor layer 14 be 10 nm to 100 nm.

Furthermore, here, "alkyl-DNTT" indicates a compound in which one or more hydrogen atoms in DNTT is substituted with an alkyl group, and "alkyl-DNBDT" indicates a compound in which one or more hydrogen atoms in DNBDT is substituted with an alkyl group.

Known materials such as single metal such as gold, platinum, silver, aluminum, and titanium; and a metal oxide such as an indium tin oxide (ITO) and a zinc oxide (ZnO) can be exemplified as the material of the source electrode 15 and the drain electrode 16.

It is preferable that the thickness of the source electrode 15 and the drain electrode 16 be 10 nm to 1000 nm.

As illustrated herein, it is preferable that the source electrode 15 and the drain electrode 16 be disposed on the semiconductor layer 14 through the intermediate layer 18, and the intermediate layer 18, for example, be formed as a hole injection layer or an electron accepting layer by selecting a material containing suitable components.

It is preferable that the thickness of the intermediate layer 18 be 0.2 nm to 10 nm.

Known materials such as 3,4-polyethylene dioxy thiophene/polystyrene sulfonic acid (PEDOT/PSS) can be exemplified as the material of the intermediate layer 18 which functions as the hole injection layer or the electron accepting layer, and 1,3,4,5,7,8-hexafluorotetracyanonaphthoquinodimethane (hereinafter, simply referred to as "F6-TNAP") and 2,3,5,6-tetrafluoro-7,7,8,8-tetracyanoquinodimethane (hereinafter, simply referred to as "F4-TCNQ") are preferable. F6-TNAP and F4-TCNQ, for example, can be manufactured by a method disclosed in "Chem. Mater. 2010, 22, 3926-3932".

It is preferable that a distance L between the source electrode 15 and the drain electrode 16 (hereinafter, simply referred to as a "channel length") be 0.2 μm to 100 μm.

In addition, it is preferable that the width in a direction perpendicular to a facing direction of the source electrode 15 and the drain electrode 16 (not illustrated in FIG. 1, refer to the symbol "W" in FIG. 5, and hereinafter, simply referred to as a "channel width") be 1 μm to 5000 μm.

In the transistor 1, when a voltage is applied to the gate electrode 12, carriers (holes and electrons) are generated in the vicinity of a boundary surface between the semiconductor layer 14 and the insulating layer 13, and thus electrical conductivity increases, and when a voltage is applied between the source electrode 15 and the drain electrode 16, the carriers are moved to the source electrode 15 or the drain electrode 16, and thus a current flows. At this time, in the vicinity of the boundary surface between the semiconductor layer 14 and the insulating layer 13, the carriers are moved along the boundary surface.

On the other hand, in the transistor 1, the surface smoothness of the gate electrode 12 is high (concavities and convexities are small), and thus the surface smoothness of the insulating layer 13 disposed on the gate electrode 12 is also high without depending on the thickness thereof (in both of a case where the thickness is thick and a case where the thickness is thin) according to the smoothness thereof. Therefore, in the vicinity of the boundary surface between the semiconductor layer 14 and the insulating layer 13, the carriers are moved along the boundary surface, and even when a movement distance of the carrier is affected by the concavities and convexities on the surface of the insulating layer 13, the movement distance is remarkably shorter than a case where the concavities and convexities are large (the smoothness is low). Accordingly, the transistor 1 has high mobility of the carrier.

The transistor according to the present invention is not limited to the description herein, but for example, a part of the configuration of the transistor 1 may be changed insofar as the transistor may include the gate electrode formed by using the silver β-ketocarboxylate (1) as a gate electrode, within a range not impairing the effects of the present invention.

Figure 2:
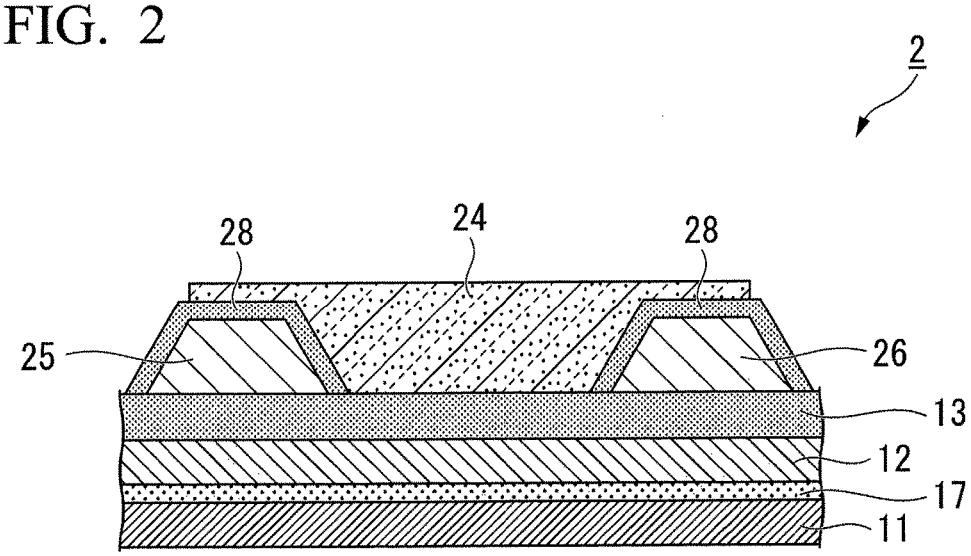
FIG. 2 is a schematic sectional view illustrating another example of the transistor according to the present invention.

It is preferable that the transistor according to the present invention be a bottom gate type transistor including the gate electrode on the substrate side from the semiconductor layer (in FIG. 1, the lower side), and examples of the transistor include a transistor having a bottom gate and top contact type structure in which the source electrode and the drain electrode are disposed with respect to the semiconductor layer on a side opposite to the substrate side (in FIG. 1, on the upper side) as exemplified in FIG. 1, and, for example, a transistor having a bottom gate and bottom contact type structure in which the source electrode and the drain electrode are disposed with respect to the semiconductor layer on the substrate side (in FIG. 1, the lower side) as exemplified in FIG. 2. Furthermore, in FIG. 2, the same reference numerals are applied to the same constituents as those of FIG. 1, and the detailed description thereof will be omitted. The same applies to the following drawings relevant to the transistor.

A transistor 2 illustrated in FIG. 2 includes the gate electrode 12 and the insulating layer 13 on the substrate 11 in this order, and includes a source electrode 25 and a drain electrode 26 on the insulating layer 13 to face each other. In addition, the gate electrode 12 is disposed on the substrate 11 through the modification layer 17, the modification layer 17 is disposed on one entire main surface (the upper surface) of the substrate 11, and the gate electrode 12 is disposed on one entire main surface (the upper surface) of the modification layer 17. In addition, the surfaces of the source electrode 25 and the drain electrode 26 are respectively covered with an intermediate layer 28, and a semiconductor layer 24 is disposed on the source electrode 25 and the drain electrode 26 through the intermediate layer 28. The semiconductor layer 24 is further disposed on the surface of a portion of the insulating layer 13 in which the source electrode 25, the drain electrode 26, and the intermediate layer 28 are not disposed.

The substrate 11, the gate electrode 12, the insulating layer 13, and the modification layer 17 of the transistor 2 are identical to the substrate 11, the gate electrode 12, the insulating layer 13, and the modification layer 17 of the transistor 1 illustrated in FIG. 1.

The semiconductor layer 24, the source electrode 25, and the drain electrode 26 of the transistor 2 are identical to the semiconductor layer 14, the source electrode 15, and the drain electrode 16 of the transistor 1 illustrated in FIG. 1 except that the shapes thereof are different, and for example, the semiconductor layer 24, the source electrode 25, and the drain electrode 26 can be configured such that the maximum thickness thereof is identical to the thickness of the semiconductor layer 14, the source electrode 15, and the drain electrode 16 described above.

The intermediate layer 28 of the transistor 2 is identical to the intermediate layer 18 of the transistor 1 illustrated in FIG. 1 except that the shape thereof is different.

Figure 3:
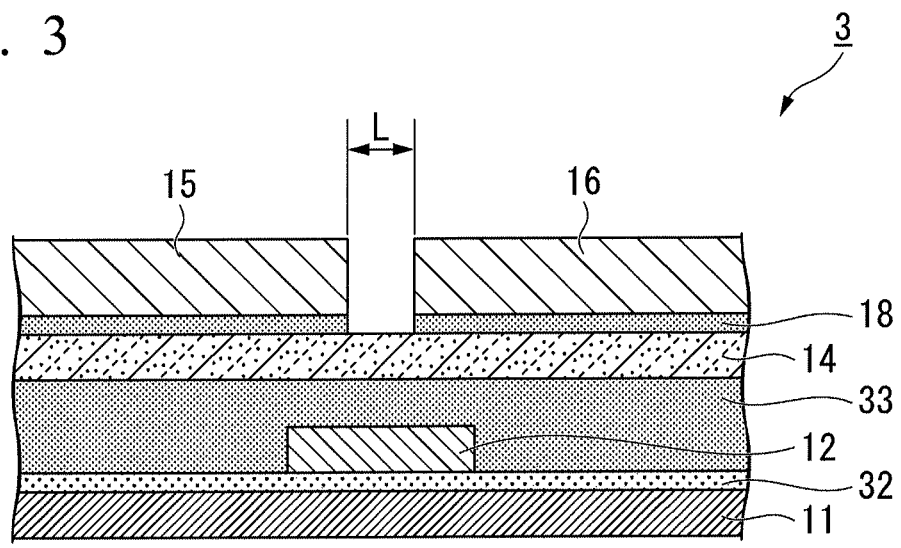
FIG. 3 is a schematic sectional view illustrating another example of the transistor according to the present invention.

The transistor in which the gate electrode is disposed on the entire upper surface of the substrate or the modification layer has been described, but as illustrated in FIG. 3, a transistor in which the gate electrode is disposed on a part of the upper surface of the substrate or the modification layer is also preferable as the transistor according to the present invention, and in this case, the gate electrode may be patterned.

A transistor 3 illustrated in FIG. 3 is identical to the transistor 1 illustrated in FIG. 1 except that a gate electrode 32 is disposed on a part of the upper surface of the modification layer 17 (the substrate 11). Furthermore, in the transistor 2 illustrated in FIG. 2, a transistor which is configured such that the gate electrode 12 is disposed on a part of the upper surface of the modification layer 17 (the substrate 11) is also preferable as the transistor according to the present invention.

The substrate 11, the semiconductor layer 14, the source electrode 15, the drain electrode 16, the modification layer 17, and the intermediate layer 18 of the transistor 3 are identical to the substrate 11, the semiconductor layer 14, the source electrode 15, the drain electrode 16, the modification layer 17, and the intermediate layer 18 of the transistor 1 illustrated in FIG. 1. Furthermore, the modification layer 17 may be formed only in a region where the gate electrode 32 is formed on the substrate 11.

The gate electrode 32 and the insulating layer 33 of the transistor 3 are identical to the gate electrode 12 and the insulating layer 13 of the transistor 1 illustrated in FIG. 1 except that the shape thereof is different, and for example, the insulating layer 33 can be configured such that the maximum thickness thereof is identical to the thickness of the insulating layer 13 described above.

The transistor according to the present invention has higher mobility of the carrier than other transistors, and for example, the mobility of the carrier in a linear region is preferably greater than or equal to 4.7 cm$^2$/Vs, and the mobility of the carrier in a saturated region is preferably greater than or equal to 4.0 cm$^2$/Vs. In addition, according to this, the transistor according to the present invention can have more preferred properties by setting a threshold voltage to be in a preferred range, by decreasing an OFF current, and by increasing a current ON/OFF ratio.

The mobility of the carrier is obtained by a known method. For example, the mobility of the carrier can be calculated by obtaining a relationship between a drain current $I_D$ and a gate voltage $V_G$ when a drain voltage $V_D$ of the transistor is a predetermined value, and by respectively using General Formula (i) described below in the linear region and General Formula (ii) described below in the saturated region.

$$\mu_{lin} = \frac{L}{WC_iV_D} \frac{\delta I_D}{\delta V_G} \quad \text{(i)}$$

$$\mu_{sat} = \frac{2L}{WC_i} \left(\frac{\delta\sqrt{I_D}}{\delta V_G}\right)^2 \quad \text{(ii)}$$

(In the formula, $\mu_{lin}$ represents the mobility of the carrier in the linear region; $\mu_{sat}$ represents the mobility of the carrier in the saturated region; L represents a channel length; W represents a channel width; $C_i$ represents electrostatic capacitance per unit area of the insulating layer; $I_D$ represents a drain current; $V_D$ represents a drain voltage; and $V_G$ represents a gate voltage.)

The transistor according to the present invention is suitable for being operated at a high frequency, and in particular, the transistor becomes more preferable by shortening the channel length such that the channel length, for example, is less than or equal to 10 μm. For example, as described below in examples, the maximum frequency at the time of performing rectification in a circuit in which the transistor according to the present invention is incorporated can be preferably greater than or equal to 13.5 MHz, and such a transistor, for example, is particularly useful for RFID communication.

The transistor 1, for example, can be manufactured by the following method. FIG. 4A to FIG. 4F are schematic sectional views illustrating an example of a manufacturing method of the transistor 1.

Figure 4A:
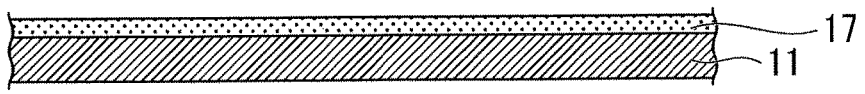
FIG. 4A is a schematic sectional view illustrating an example of a manufacturing method of a transistor according to the present invention.

First, as illustrated in FIG. 4A, the modification layer 17 is formed on the substrate 11.

A formation method of the modification layer 17 may be selected according to the material thereof. For example, when a silane coupling agent is used, the modification layer 17 can be formed by applying a liquid composition formed by being blended with the silane coupling agent onto the substrate 11, and by drying the liquid composition, and the liquid composition can be applied by a method using a spin coater (a spin coating method) or the like. In addition, the modification layer 17 can be formed by arranging the silane coupling agent and the substrate 11 in an airtight container, by vaporizing the silane coupling agent with heat as necessary, and by attaching the silane coupling agent onto the substrate 11.

Figure 4B:
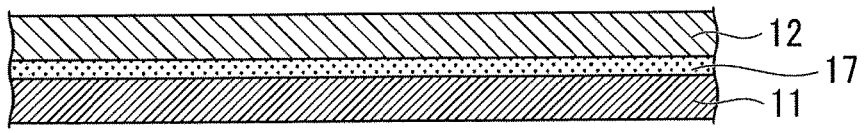
FIG. 4B is a schematic sectional view illustrating an example of the manufacturing method of a transistor according to the present invention.

Next, as illustrated in FIG. 4B, the gate electrode 12 is formed on the modification layer 17.

The gate electrode 12 can be formed by preparing a silver ink composition formed by being blended with the silver β-ketocarboxylate (1), by attaching the silver ink composition onto the surface of the modification layer 17, by suitably selecting a post-treatment such as a drying treatment or a heating (a calcining) treatment as necessary, and by forming metal silver. The silver ink composition and an attachment method will be described below in more detail. The heating treatment may be performed along with the drying treatment.

When a transistor in which the gate electrode is disposed on a part of the upper surface of the modification layer (the substrate) is manufactured as illustrated in FIG. 3, for example, the metal silver may be formed by attaching the silver ink composition onto only a part of a region, not the entire surface of the modification layer 17, or as described above, the gate electrode may be formed by attaching the silver ink composition onto the entire surface of the modification layer 17, by performing photolithography and etching with respect to a silver layer formed of the metal silver, and by patterning the silver layer into a desired shape. Here, the photolithography and the etching may be performed by a known method, a resist pattern may be formed on the silver layer, and the exposed silver layer may be removed by etching.

Figure 4C:
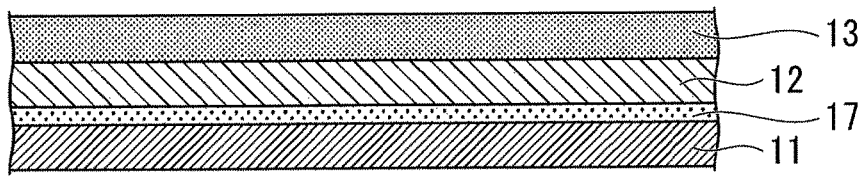
FIG. 4C is a schematic sectional view illustrating an example of the manufacturing method of a transistor according to the present invention.

Next, as illustrated in FIG. 4C, the insulating layer 13 is formed on the substrate 11 to cover the gate electrode 12. The insulating layer 13 can be formed by known methods such as a spin coating method, a sputtering method, and an atomic layer deposition method (an ALD method).

The ALD method is a method for forming a film having a desired thickness of a target substance by repeating one cycle of film formation in which gas of a raw material compound (adsorption gas) is introduced and adsorbed onto a substrate in a reaction chamber under vacuum conditions, a single layer is formed by the molecules, and then surplus molecules are removed by purging, and subsequently, gas of a reactive compound (reactive gas) is introduced to react with the single layer, a target substance is generated, and byproducts and surplus reactive compounds are removed by purging. For example, when an alumina ($Al_2O_3$) film is formed, gas of an organic aluminum compound such as triethyl aluminum can be used as the adsorption gas, gas of an oxidizing compound such as water and ozone can be used as the reactive gas, and inert gas such as nitrogen gas can be used as purge gas. The details of the ALD method, for example, are disclosed in various literatures such as "Japanese Unexamined Patent Application, First Publication No. 2003-347042".

Figure 4D:
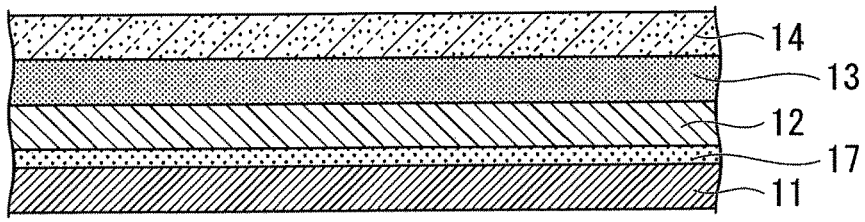
FIG. 4D is a schematic sectional view illustrating an example of the manufacturing method of a transistor according to the present invention.

Next, as illustrated in FIG. 4D, the semiconductor layer 14 is formed on the insulating layer 13.

The semiconductor layer 14 may be formed by a known method according to the material thereof, and for example, the semiconductor layer 14 formed of an inorganic semiconductor can be formed by a vacuum deposition method, and the semiconductor layer 14 formed of an organic semiconductor can be formed by various printing methods or various coating methods. In the printing method or the coating method, a liquid composition formed by being blended with a raw material (a semiconductor compound) for configuring the semiconductor layer 14 is provided in printing or coating.

In addition, for example, in "PCT International Publication No. WO2011/040155", the semiconductor layer 14 can be formed by a method disclosed in reference to FIGS. 1A, 1B, 2A, 2B, and the like, that is, a method (hereinafter, simply referred to as an "edge casting method") in which a substrate and an end surface contact member are used, liquid droplets are formed by supplying a raw material solution (the liquid composition) onto the substrate to be in contact with the end surface contact member, the liquid droplets are dried, and thus a semiconductor film is formed.

Figure 4E:
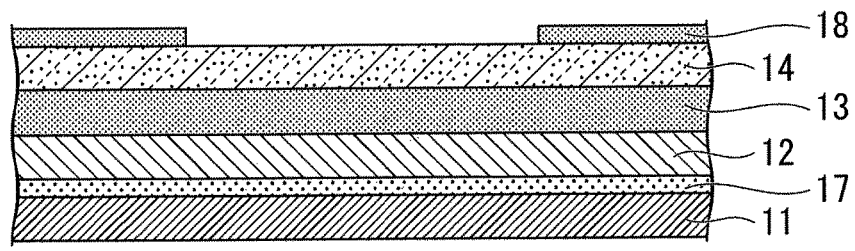
FIG. 4E is a schematic sectional view illustrating an example of the manufacturing method of a transistor according to the present invention.

Next, as illustrated in FIG. 4E, the intermediate layer 18 is formed on the semiconductor layer 14.

The intermediate layer 18 may be formed by a known method according to the material thereof. For example, the intermediate layer 18 can be formed by attaching a liquid composition formed by being blended with a raw material for configuring the intermediate layer 18 onto the semiconductor layer 14 using various printing methods, and by drying the liquid composition. In addition, the intermediate layer 18 can be formed on the semiconductor layer 14 by a vacuum deposition method, and for example, the intermediate layer 18 may be formed by forming a film formed of the material of the intermediate layer 18 using a vacuum deposition method, and then by patterning the film into a desired shape by photolithography, or the intermediate layer 18 may be directly formed into a desired shape through a metal mask using a vacuum deposition method.

Figure 4F:
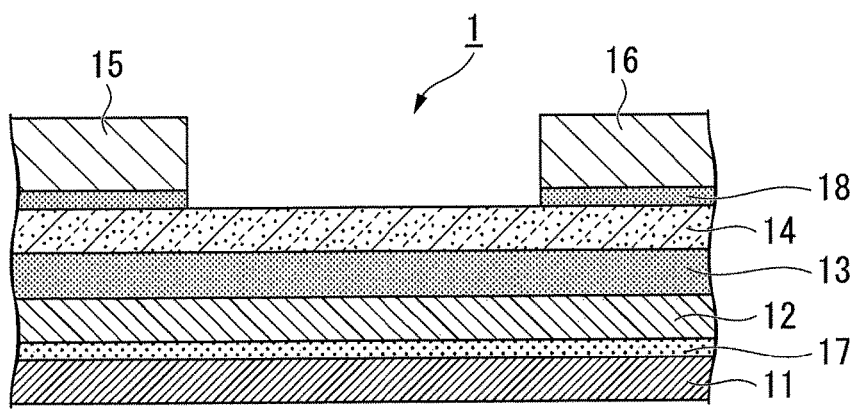
FIG. 4F is a schematic sectional view illustrating an example of the manufacturing method of a transistor according to the present invention.

Next, as illustrated in FIG. 4F, the source electrode 15 and the drain electrode 16 are formed on the intermediate layer 18.

The source electrode 15 and the drain electrode 16 can be formed by a known method, and for example, the source electrode 15 and the drain electrode 16 may be formed by forming a film formed of the material of these electrodes using a vacuum deposition method, and then by patterning the film into a desired shape by photolithography, or the source electrode 15 and the drain electrode 16 may be formed by directly forming an electrode into a desired shape through a metal mask using a vacuum deposition method.

In the manufacturing method described above, the gate electrode 12 can be formed by performing various printing methods or various coating methods under the atmosphere using a silver ink composition. In addition, it is not necessary to increase surface smoothness at the time of forming the insulating layer 13 or to separately form a smoothing layer on the insulating layer 13, and thus it is possible to manufacture the transistor 1 through more simplified steps at a lower cost. In addition, the surface smoothness of the gate electrode 12 is high, and thus the transistor 1 has high mobility of the carrier.

Furthermore, the transistor 2 can be manufactured by the same method as that of the transistor 1 except that the forming sequence and the shape of the semiconductor layer 24, the source electrode 25, the drain electrode 26, and the intermediate layer 28 are different from the forming sequence and the shape of the semiconductor layer 14, the source electrode 15, the drain electrode 16, and the intermediate layer 18.

<Silver Ink Composition>

The silver ink composition is formed by being blended with the silver β-ketocarboxylate (1).

A liquid silver ink composition is preferable as the silver ink composition, and a silver ink composition in which the silver β-ketocarboxylate (1) is dissolved or uniformly dispersed is preferable as the silver ink composition.

One type of silver β-ketocarboxylate (1) may be independently used, or two or more types of silver β-ketocarboxylates (1) may be used together, and when two or more types of silver β-ketocarboxylates (1) are used together, the combination and the ratio thereof can be arbitrarily adjusted.

[Silver β-Ketocarboxylate (1)]

The silver β-ketocarboxylate (1) is denoted by General Formula (1) described above.

In the formula, R represents an aliphatic hydrocarbon group having 1 to 20 carbon atoms or a phenyl group in which one or more hydrogen atoms may be substituted with a substituent group, a hydroxyl group, an amino group, or a group denoted by a general formula "$R^1$—$CY^1_2$—", "$CY^1_3$—", "$R^1$—$CHY^1$—", "$R_2O$—", "$R^5R^4N$—", "$(R^3O)_2CY^1$—", or "$R^6$—C(=O)—$CY^1_2$—";

The aliphatic hydrocarbon group having 1 to 20 carbon atoms in R may be any one of a straight-chain aliphatic hydrocarbon group, a branched-chain aliphatic hydrocarbon group, and a cyclic aliphatic hydrocarbon group (an alicyclic group), and when the aliphatic hydrocarbon group is a cyclic aliphatic hydrocarbon group, the aliphatic hydrocarbon group may be either a monocyclic aliphatic hydrocarbon group or a polycyclic aliphatic hydrocarbon group. In addition, the aliphatic hydrocarbon group may be either a saturated aliphatic hydrocarbon group or an unsaturated aliphatic hydrocarbon group. The aliphatic hydrocarbon group is preferably an aliphatic hydrocarbon group having 1 to 10 carbon atoms, and is more preferably an aliphatic hydrocarbon group having 1 to 6 carbon atoms. An alkyl group, an alkenyl group, and an alkynyl group can be exemplified as a preferred aliphatic hydrocarbon group in R.

A methyl group, an ethyl group, a n-propyl group, an isopropyl group, a n-butyl group, an isobutyl group, a sec-butyl group, a tert-butyl group, a n-pentyl group, an isopentyl group, a neopentyl group, a tert-pentyl group, a 1-methylbutyl group, a 2-methylbutyl group, a n-hexyl group, a 1-methylpentyl group, a 2-methylpentyl group, a 3-methylpentyl group, a 4-methylpentyl group, a 1,1-dimethylbutyl group, a 2,2-dimethylbutyl group, a 3,3-dimethylbutyl group, a 2,3-dimethylbutyl group, a 1-ethylbutyl group, a 2-ethylbutyl group, a 3-ethylbutyl group, a 1-ethyl-1-methylpropyl group, a n-heptyl group, a 1-methylhexyl group, a 2-methylhexyl group, a 3-methylhexyl group, a 4-methylhexyl group, a 5-methylhexyl group, a 1,1-dimethylpentyl group, a 2,2-dimethylpentyl group, a 2,3-dimethylpentyl group, a 2,4-dimethylpentyl group, a 3,3-dimethylpentyl group, a 4,4-dimethylpentyl group, a 1-ethylpentyl group, a 2-ethylpentyl group, a 3-ethylpentyl group, a 4-ethylpentyl group, a 2,2,3-trimethylbutyl group, a 1-propylbutyl group, a n-octyl group, an isooctyl group, a 1-methylheptyl group, a 2-methylheptyl group, a 3-methylheptyl group, a 4-methylheptyl group, a 5-methylheptyl group, a 1-ethylhexyl group, a 2-ethylhexyl group, a 3-ethylhexyl group, a 4-ethylhexyl group, a 5-ethylhexyl group, a 1,1-dimethylhexyl group, a 2,2-dimethylhexyl group, a 3,3-dimethylhexyl group, a 4,4-dimethylhexyl group, a 5,5-dimethylhexyl group, a 1-propylpentyl group, a 2-propylpentyl group, a nonyl group, a decyl group, a undecyl group, a dodecyl group, a tridecyl group, a tetradecyl group, a pentadecyl group, a hexadecyl group, a heptadecyl group, an octadecyl group, a nonadecyl group, and an icosyl group can be exemplified as the straight-chain alkyl group or the branched-chain alkyl group in R.

A cyclopropyl group, a cyclobutyl group, a cyclopentyl group, a cyclohexyl group, a cycloheptyl group, a cyclooctyl group, a cyclononyl group, a cyclodecyl group, a norbornyl group, an isobornyl group, a 1-adamantyl group, a 2-adamantyl group, and a tricyclodecyl group can be exemplified as the cyclic alkyl group in R.

A group in which one single bond (C—C) between carbon atoms of the alkyl group in R is substituted with a double bond (C=C), such as a vinyl group (an ethenyl group, —CH=CH$_2$), an allyl group (a 2-propenyl group, —CH$_2$—CH=CH$_2$), a 1-propenyl group (—CH=CH—CH$_3$), an isopropenyl group (—C(CH$_3$)=CH$_2$), a 1-butenyl group (—CH=CH—CH$_2$—CH$_3$), a 2-butenyl group (—CH$_2$—CH=CH—CH$_3$), a 3-butenyl group (—CH$_2$—CH$_2$—CH=CH$_2$), and a cyclohexenyl group, a cyclopentenyl group can be exemplified as the alkenyl group in R.

A group in which one single bond (C—C) between carbon atoms of the alkyl group in R is substituted with a triple bond (CC), such as an ethynyl group (—CCH) and a propargyl group (—CH$_2$—CCH) can be exemplified as the alkynyl group in R.

In the aliphatic hydrocarbon group having 1 to 20 carbon atoms in R, one or more hydrogen atoms may be substituted with a substituent group, and a fluorine atom, a chlorine atom, and a bromine atom can be exemplified as a preferred substituent group. In addition, the number of the substituent groups and the position thereof are not particularly limited. When a plurality of substituent groups are used, the plurality of substituent groups may be identical to each other or different from each other. That is, all of the substituent groups may be identical to each other, all of the substituent groups may be different from each other, or only a part of the substituent groups may be different.

In the phenyl group in R, one or more hydrogen atoms may be substituted with a substituent group, and a saturated univalent aliphatic hydrocarbon group or an unsaturated univalent aliphatic hydrocarbon group having 1 to 16 carbon atoms, a univalent group formed by bonding the aliphatic hydrocarbon group to an oxygen atom, a fluorine atom, a chlorine atom, a bromine atom, a hydroxyl group (—OH), a cyano group (—CN), a phenoxy group (—O—C$_6$H$_5$), and the like can be exemplified as a preferred substituent group, and the number of substituent groups and the position thereof are not particularly limited. When a plurality of substituent groups are used, the plurality of substituent groups may be identical to each other or different from each other.

The same aliphatic hydrocarbon group as that in R can be exemplified as the aliphatic hydrocarbon group which is a substituent group, except that the number of carbon atoms is 1 to 16.

$Y^1$s in R each independently represents a fluorine atom, a chlorine atom, a bromine atom, or a hydrogen atom. In general formulas "$R^1$—$CY^1{}_2$—", "$CY^1{}_3$—", and "$R^6$—C(=O)—$CY^1{}_2$—", a plurality of $Y^1$s may be identical to each other or different from each other, respectively.

$R^1$ in R represents an aliphatic hydrocarbon group having 1 to 19 carbon atoms or a phenyl group (C$_6$H$_5$—), and the same aliphatic hydrocarbon group as that in R can be exemplified as the aliphatic hydrocarbon group in $R^1$ except that the number of carbon atoms is 1 to 19.

$R^2$ in R represents an aliphatic hydrocarbon group having 1 to 20 carbon atoms, and the same aliphatic hydrocarbon group as that in R can be exemplified as the aliphatic hydrocarbon group.

$R^3$ in R represents an aliphatic hydrocarbon group having 1 to 16 carbon atoms, and the same aliphatic hydrocarbon group as that in R can be exemplified as the aliphatic hydrocarbon group except that the number of carbon atoms is 1 to 16.

$R^4$ and $R^5$ in R each independently represents an aliphatic hydrocarbon group having 1 to 18 carbon atoms. That is, $R^4$ and $R^5$ may be identical to each other or different from each other, and the same aliphatic hydrocarbon group as that in R can be exemplified as the aliphatic hydrocarbon group except that the number of carbon atoms is 1 to 18.

$R^6$ in R represents an aliphatic hydrocarbon group having 1 to 19 carbon atoms, a hydroxyl group, or a group denoted by a formula "AgO—", and the same aliphatic hydrocarbon group as that in R can be exemplified as the aliphatic hydrocarbon group in $R^6$ except that the number of carbon atoms is 1 to 19.

Among them, it is preferable that R represent a straight-chain alkyl group or a branched-chain alkyl group, a group denoted by a general formula "$R^6$—C(=O)—$CY^1{}_2$—", a hydroxyl group, or a phenyl group. Then, it is preferable that $R^6$ represent a straight-chain alkyl group or a branched-chain alkyl group, a hydroxyl group, or a group denoted by a formula "AgO—".

In General Formula (1), $X^1$s each independently represents a hydrogen atom, an aliphatic hydrocarbon group having 1 to 20 carbon atoms, a halogen atom, a phenyl group or a benzyl group (C$_6$H$_5$—CH$_2$—) in which one or more hydrogen atoms may be substituted with a substituent group, a cyano group, a N-phthaloyl-3-aminopropyl group, a 2-ethoxyvinyl group (C$_2$H$_5$—O—CH=CH—), or a group denoted by a general formula "$R^7$O—", "R'S—", "$R^7$—C(=O)—", or "$R^7$—C(=O)—O—".

The same aliphatic hydrocarbon group as that in R can be exemplified as the aliphatic hydrocarbon group having 1 to 20 carbon atoms in $X^1$.

A fluorine atom, a chlorine atom, a bromine atom, and an iodine atom can be exemplified as the halogen atom in $X^1$.

In the phenyl group and the benzyl group in $X^1$, one or more hydrogen atoms may be substituted with a substituent group, and a halogen atom (a fluorine atom, a chlorine atom, a bromine atom, and an iodine atom), a nitro group (—NO$_2$), and the like can be exemplified as a preferred substituent group, but the number of substituent groups and the position thereof are not particularly limited. When a plurality of substituent groups are used, the plurality of substituent groups may be identical to each other or different from each other.

$R^7$ in $X^1$ represents an aliphatic hydrocarbon group having 1 to 10 carbon atoms, a thienyl group (C$_4$H$_3$S—), or a phenyl group or a diphenyl group (a biphenyl group, C$_6$H$_5$—C$_6$H$_4$—) in which one or more hydrogen atoms may be substituted with a substituent group. The same aliphatic hydrocarbon group as that in R can be exemplified as the aliphatic hydrocarbon group in $R^7$ except that the number of carbon atoms is 1 to 10. In addition, a halogen atom (a fluorine atom, a chlorine atom, a bromine atom, and an iodine atom) and the like can be exemplified as the substituent group of the phenyl group and the diphenyl group in $R^7$, but the number of substituent groups and the position thereof are not particularly limited. When a plurality of substituent groups are used, the plurality of substituent groups may be identical to each other or different from each other.

When $R^7$ represents a thienyl group or a diphenyl group, a bonding position between the thienyl group or the diphenyl group and a group or an atom (an oxygen atom, a sulfur atom, a carbonyl group, and a carbonyl oxy group) adjacent thereto in $X^1$ is not particularly limited. For example, the thienyl group may be a 2-thienyl group and a 3-thienyl group.

In General Formula (1), two $X^1$s may be bonded to a carbon atom interposed between two carbonyl groups as one group through a double bond, and a group denoted by a formula "=CH—$C_6H_4$—$NO_2$" can be exemplified as such $X^1$.

Among them, it is preferable that $X^1$ represent a hydrogen atom, a straight-chain alkyl group or a branched-chain alkyl group, a benzyl group, or a group denoted by a general formula "$R^7$—C(=O)—", and it is preferable that at least one $X^1$ be a hydrogen atom.

The silver β-ketocarboxylate (1) is preferably silver 2-methylacetoacetate ($CH_3$—C(=O)—CH($CH_3$)—C(=O)—OAg), silver acetoacetate ($CH_3$—C(=O)—$CH_2$—C(=O)—OAg), silver 2-ethylacetoacetate ($CH_3$—C(=O)—CH($CH_2CH_3$)—C(=O)—OAg), silver propionylacetate ($CH_3CH_2$—C(=O)—$CH_2$—C(=O)—OAg), silver isobutyrylacetate (($CH_3$)$_2$CH—C(=O)—$CH_2$—C(=O)—OAg), silver pivaloylacetate (($CH_3$)$_3$C—C(=O)—$CH_2$—C(=O)—OAg), silver 2-n-butylacetoacetate ($CH_3$—C(=O)—CH($CH_2CH_2CH_2CH_3$)—C(=O)—OAg), silver 2-benzylacetoacetate ($CH_3$—C(=O)—CH($CH_2C_6H_5$)—C(=O)—OAg), silver benzoylacetate ($C_6H_5$—C(=O)—$CH_2$—C(=O)—OAg), silver pivaloylacetoacetate (($CH_3$)$_3$C—C(=O)—$CH_2$—C(=O)—$CH_2$—C(=O)—OAg), silver isobutyrylacetoacetate (($CH_3$)$_2$CH—C(=O)—$CH_2$—C(=O)—$CH_2$—C(=O)—OAg), silver 2-acetylpivaloylacetate (($CH_3$)$_3$C—C(=O)—CH(—C(=O)—$CH_3$)—C(=O)—OAg), silver 2-acetylisobutyrylacetate (($CH_3$)$_2$CH—C(=O)—CH(—C(=O)—$CH_3$)—C(=O)—OAg), or silver acetone dicarboxylate (AgO—C(=O)—$CH_2$—C(=O)—$CH_2$—C(=O)—OAg), and is more preferably silver 2-methylacetoacetate, silver acetoacetate, silver 2-ethylacetoacetate, silver propionylacetate, silver isobutyrylacetate, silver pivaloylacetate, silver 2-n-butylacetoacetate, silver 2-benzylacetoacetate, silver benzoylacetate, silver pivaloylacetoacetate, silver isobutyrylacetoacetate, or silver acetone dicarboxylate.

The silver β-ketocarboxylate (1) can further reduce the concentration of the remaining raw material or impurities in derivatives (metal silver) formed by a post-treatment such as a drying treatment or a heating (a calcining) treatment. As the amount of raw material or impurities becomes smaller, for example, contact between formed metal silvers becomes excellent, conduction is easily performed, and resistivity decreases.

As described below, the silver β-ketocarboxylate (1) can be decomposed at a low temperature such as, preferably 60° C. to 210° C., and more preferably 60° C. to 200° C. without using a reducing agent or the like which is known in the field, and can form metal silver. Then, by using the reducing agent together, the silver β-ketocarboxylate (1) is decomposed at a lower temperature and forms metal silver.

In the present invention, one type of silver β-ketocarboxylate (1) may be independently used, or two or more types of silver β-ketocarboxylates (1) may be used together. When two or more types of silver β-ketocarboxylates (1) are used together, the combination and the ratio thereof can be arbitrarily adjusted.

In the silver ink composition, the content of silver derived from the silver β-ketocarboxylate (1) is preferably greater than or equal to 5 mass %, and is more preferably greater than or equal to 10 mass %. By setting the content of the silver to be in this range, the quality of the formed metal silver becomes more excellent. The upper limit value of the content of the silver is not particularly limited insofar as the effects of the present invention is not impaired, but it is preferable that the upper limit value of the content of the silver be 25 mass % in consideration of handling properties.

Furthermore, herein, unless otherwise particularly stated, the "silver derived from the silver β-ketocarboxylate (1)" indicates silver in the silver β-ketocarboxylate (1) which is blended therewith at the time of manufacturing the silver ink composition, and is a concept including both silver configuring the silver β-ketocarboxylate (1) continuously after blending, and silver in a decomposition product which is generated by the decomposition of the silver β-ketocarboxylate (1) after blending and silver itself.

[Nitrogen-Containing Compound]

It is preferable that the silver ink composition be blended with one or more types of nitrogen-containing compounds (hereinafter, simply referred to as a "nitrogen-containing compound") selected from the group consisting of an amine compound and a quaternary ammonium salt having carbon atoms of less than or equal to 25, ammonia, and an ammonium salt formed by a reaction between the amine compound or the ammonia and an acid, in addition to the silver β-ketocarboxylate (1).

Hereinafter, the amine compound having carbon atoms of less than or equal to 25 will be simply referred to as an "amine compound", the quaternary ammonium salt having carbon atoms of less than or equal to 25 will be simply referred to as a "quaternary ammonium salt", the ammonium salt formed by the reaction between the amine compound having carbon atoms of less than or equal to 25 and the acid will be simply referred to as an "ammonium salt derived from an amine compound", and the ammonium salt formed by the reaction between the ammonia and the acid will be simply referred to as an "ammonium salt derived from ammonia".

(Amine Compound and Quaternary Ammonium Salt)

The amine compound has 1 to 25 carbon atoms, and may be any one of a primary amine, a secondary amine, and a tertiary amine. In addition, the quaternary ammonium salt has 4 to 25 carbon atoms. The amine compound and the quaternary ammonium salt may be in the shape of either a chain or a ring. In addition, the number of nitrogen atoms configuring an amine portion or an ammonium salt portion (for example, nitrogen atoms configuring an amino group (—$NH_2$) of primary amine) may be 1 or may be greater than or equal to 2.

Monoalkylamine, monoarylamine, mono(heteroaryl)amine, diamine, and the like in which one or more hydrogen atoms may be substituted with a substituent group can be exemplified as the primary amine.

An alkyl group configuring the monoalkylamine may be any one of a straight-chain alkyl group, a branched-chain alkyl group, and a cyclic alkyl group, the same alkyl group as that in R can be exemplified as the alkyl group, and it is preferable that the alkyl group be a straight-chain alkyl group or a branched-chain alkyl group having 1 to 19 carbon atoms, or a cyclic alkyl group having 3 to 7 carbon atoms.

Specifically, n-butylamine, n-hexylamine, n-octylamine, n-dodecylamine, n-octadecylamine, sec-butylamine, tert-butylamine, 3-aminopentane, 3-methylbutylamine, 2-aminooctane, 2-ethylhexylamine, and 1,2-dimethyl-n-propylamine can be exemplified as the preferred monoalkyl amine.

A phenyl group, a 1-naphtyl group, a 2-naphtyl group, and the like can be exemplified as an aryl group configuring the monoarylamine, and it is preferable that the aryl group be an aryl group having 6 to 10 carbon atoms.

A heteroaryl group configuring the mono(heteroaryl)amine includes a heteroaryl group having a heteroatom as an atom configuring an aromatic ring skeleton, and a nitrogen atom, a sulfur atom, an oxygen atom, and a boron atom can be exemplified as the heteroatom. In addition, the number of heteroatoms configuring the aromatic ring skeleton is not particularly limited, but may be 1 or may be greater than or equal to 2. When the number of heteroatoms is greater than or equal to 2, these heteroatoms may be identical to each other or different from each other. That is, all of the heteroatoms may be identical to each other, all of the heteroatoms may be different from each other, or only a part of the heteroatoms may be different.

The heteroaryl group may be either a monocyclic heteroaryl group or a polycyclic heteroaryl group, and the number of ring members (the number of atoms configuring a ring skeleton) is not particularly limited, but it is preferable that the heteroaryl group be a 3- to 12-membered ring heteroaryl group.

In the heteroaryl group, a pyrrolyl group, a pyrrolinyl group, an imidazolyl group, a pyrazolyl group, a pyridyl group, a pyrimidyl group, a pyrazinyl group, a pyridazinyl group, a triazolyl group, a tetrazolyl group, a pyrrolidinyl group, an imidazolidinyl group, a piperidinyl group, a pyrazolidinyl group, and a piperazinyl group can be exemplified as the monocyclic heteroaryl group having 1 to 4 nitrogen atoms, and the heteroaryl group is preferably a 3- to 8-membered ring heteroaryl group, and is more preferably a 5- and 6-membered ring heteroaryl group.

In the heteroaryl group, a furanyl group can be exemplified as the monocyclic heteroaryl group having 1 oxygen atom, and the heteroaryl group is preferably a 3- to 8-membered ring heteroaryl group, and is more preferably a 5- and 6-membered ring heteroaryl group.

In the heteroaryl group, a thienyl group can be exemplified as the monocyclic heteroaryl group having 1 sulfur atom, and the heteroaryl group is preferably a 3- to 8-membered ring heteroaryl group, and is more preferably a 5- and 6-membered ring heteroaryl group.

In the heteroaryl group, an oxazolyl group, an isooxazolyl group, an oxadiazolyl group, and a morpholinyl group can be exemplified as the monocyclic heteroaryl group having 1 to 2 oxygen atoms and 1 to 3 nitrogen atoms, and the heteroaryl group is preferably a 3- to 8-membered ring heteroaryl group, and is more preferably a 5- and 6-membered ring heteroaryl group.

In the heteroaryl group, a thiazolyl group, a thiadiazolyl group, and a thiazolidinyl group can be exemplified as the monocyclic heteroaryl group having 1 to 2 sulfur atoms and 1 to 3 nitrogen atoms, and the heteroaryl group is preferably a 3- to 8-membered ring heteroaryl group, and is more preferably a 5- and 6-membered ring heteroaryl group.

In the heteroaryl group, an indolyl group, an isoindolyl group, an indolizinyl group, a benzimidazolyl group, a quinolyl group, an isoquinolyl group, an imidazolyl group, a benzotriazolyl group, a tetrazolopyridyl group, a tetrazolopyridazinyl group, and a dihydrotriazolopyridazinyl group can be exemplified as the polycyclic heteroaryl group having 1 to 5 nitrogen atoms, and the heteroaryl group is preferably a 7- to 12-membered ring heteroaryl group, and is more preferably a 9- and 10-membered ring heteroaryl group.

In the heteroaryl group, a dithianaphthalenyl group and a benzothiophenyl group can be exemplified as the polycyclic heteroaryl group having 1 to 3 sulfur atoms, and the heteroaryl group is preferably a 7- to 12-membered ring heteroaryl group, and is more preferably a 9- and 10-membered ring heteroaryl group.

In the heteroaryl group, a benzooxazolyl group and a benzooxadiazolyl group can be exemplified as the polycyclic heteroaryl group having 1 to 2 oxygen atoms and 1 to 3 nitrogen atoms, and the heteroaryl group is preferably a 7- to 12-membered ring heteroaryl group, and is more preferably a 9- and 10-membered ring heteroaryl group.

In the heteroaryl group, a benzothiazolyl group and a benzothiadiazolyl group can be exemplified as the polycyclic heteroaryl group having 1 to 2 sulfur atoms and 1 to 3 nitrogen atoms, and the heteroaryl group is preferably a 7- to 12-membered ring heteroaryl group, and is more preferably a 9- and 10-membered ring heteroaryl group.

The diamine may have two amino groups, and a positional relationship between two amino groups is not particularly limited. Diamine in which one hydrogen atom other than the hydrogen atoms configuring the amino group ($—NH_2$) in the monoalkylamine, the monoarylamine, or the mono(heteroaryl)amine substituted with an amino group can be exemplified as the preferred diamine.

It is preferable that the diamine have 1 to 10 carbon atoms, and ethylene diamine, 1,3-diamino propane, and 1,4-diamino butane can be exemplified as the more preferred diamine.

Dialkylamine, diarylamine, di(heteroaryl)amine, and the like in which one or more hydrogen atoms may be substituted with a substituent group can be exemplified as the secondary amine.

An alkyl group configuring the dialkylamine is identical to the alkyl group configuring the monoalkylamine, and it is preferable that the alkyl group be a straight-chain alkyl group or a branched-chain alkyl group having 1 to 9 carbon atoms, or a cyclic alkyl group having 3 to 7 carbon atoms. In addition, two alkyl groups in one molecule of the dialkylamine may be identical to each other or different from each other.

Specifically, N-methyl-n-hexylamine, diisobutylamine, and di(2-ethyl hexyl)amine can be exemplified as the preferred dialkylamine.

An aryl group configuring the diarylamine is identical to the aryl group configuring the monoarylamine, and it is preferable that the aryl group be an aryl group having 6 to 10 carbon atoms. In addition, two aryl groups in one molecule of the diarylamine may be identical to each other or different from each other.

A heteroaryl group configuring the di(heteroaryl)amine is identical to the heteroaryl group configuring the mono(heteroaryl)amine, and it is preferable that the heteroaryl group be a 6- to 12-membered ring heteroaryl group. In addition, two heteroaryl groups in one molecule of the di(heteroaryl)amine may be identical to each other or different from each other.

Trialkylamine, dialkylmonoarylamine, and the like in which one or more hydrogen atoms may be substituted with a substituent group can be exemplified as the tertiary amine.

An alkyl group configuring the trialkylamine is identical to the alkyl group configuring the monoalkylamine, and it is preferable that the alkyl group be a straight-chain alkyl group or a branched-chain alkyl group having 1 to 19 carbon atoms, or a cyclic alkyl group having 3 to 7 carbon atoms. In addition, three alkyl groups in one molecule of the trialkylamine may be identical to each other or different from each other. That is, all of the three alkyl groups may be identical to each other, all of the three alkyl groups may be different from each other, or only a part of the alkyl groups may be different.

Specifically, N,N-dimethyl-n-octadecylamine and N,N-dimethyl cyclohexylamine can be exemplified as the preferred trialkylamine.

An alkyl group configuring the dialkylmonoarylamine is identical to the alkyl group configuring the monoalkylamine, and it is preferable that the alkyl group be a straight-chain alkyl group or a branched-chain alkyl group having 1 to 6 carbon atoms, or a cyclic alkyl group having 3 to 7 carbon atoms. In addition, two alkyl groups in one molecule of the dialkylmonoarylamine may be identical to each other or different from each other.

An aryl group configuring the dialkylmonoarylamine is identical to the aryl group configuring the monoarylamine, and it is preferable that the aryl group be an aryl group having 6 to 10 carbon atoms.

In the present invention, tetraalkyl ammonium halide and the like in which one or more hydrogen atoms may be substituted with a substituent group can be exemplified as the quaternary ammonium salt.

An alkyl group configuring the tetraalkyl ammonium halide is identical to the alkyl group configuring the monoalkylamine, and it is preferable that the alkyl group be an alkyl group having 1 to 19 carbon atoms. In addition, four alkyl groups in one molecule of the tetraalkyl ammonium halide may be identical to each other or different from each other. That is, all of the four alkyl groups may be identical to each other, all of the four alkyl groups may be different from each other, or only a part of the alkyl groups may be different.

Fluorine, chlorine, bromine, and iodine can be exemplified as the halogen configuring the tetraalkyl ammonium halide.

Specifically, dodecyl trimethyl ammonium bromide can be exemplified as the preferred tetraalkyl ammonium halide.

The chain amine compound and the quaternary organic ammonium salt have been mainly described, and the amine compound and the quaternary ammonium salt may be a heterocyclic compound in which a nitrogen atom configuring an amine portion or an ammonium salt portion is a part of a ring skeleton structure (a heterocyclic skeleton structure). That is, the amine compound may be a cyclic amine, and the quaternary ammonium salt may be a cyclic ammonium salt. At this time, a ring (a ring including the nitrogen atom configuring the amine portion or the ammonium salt portion) structure may be either a monocyclic structure or a polycyclic structure, and the number of ring members (the number of atoms configuring the ring skeleton) is not particularly limited, but may be either an aliphatic ring or an aromatic ring.

Pyridine can be exemplified as the preferred cyclic amine.

In the primary amine, the secondary amine, the tertiary amine, and the quaternary ammonium salt, the "hydrogen atoms may be substituted with a substituent group" are hydrogen atoms other than the hydrogen atoms bonded to the nitrogen atoms configuring the amine portion or the ammonium salt portion. At this time, the number of substituent groups is not particularly limited, but may be 1 or may be greater than or equal to 2, and all of the hydrogen atoms may be substituted with a substituent group.

When a plurality of substituent groups are used, the plurality of substituent groups may be identical to each other or different from each other. That is, all of the plurality of substituent groups may be identical to each other, all of the plurality of substituent groups may be different from each other, or only a part of the plurality of substituent groups may be different. In addition, the position of the substituent group is not particularly limited.

An alkyl group, an aryl group, a halogen atom, a cyano group, a nitro group, a hydroxyl group, a trifluoromethyl group ($-CF_3$), and the like can be exemplified as the substituent group of the amine compound and the quaternary ammonium salt. Here, a fluorine atom, a chlorine atom, a bromine atom, and an iodine atom can be exemplified as the halogen atom.

When the alkyl group configuring the monoalkylamine has a substituent group, it is preferable that such an alkyl group be a straight-chain alkyl group or a branched-chain alkyl group having 1 to 9 carbon atoms which has an aryl group as a substituent group, or a cyclic alkyl group having 3 to 7 carbon atoms which preferably has an alkyl group having 1 to 5 carbon atoms as a substituent group, and specifically, 2-phenylethylamine, benzylamine, and 2,3-dimethylcyclohexylamine can be exemplified as the monoalkylamine having such a substituent group.

In addition, in the aryl group and the alkyl group which is a substituent group, one or more hydrogen atoms may be further substituted with a halogen atom, and 2-bromobenzylamine can be exemplified as the monoalkylamine having a substituent group substituted with such a halogen atom. Here, a fluorine atom, a chlorine atom, a bromine atom, and an iodine atom can be exemplified as the halogen atom.

When the aryl group configuring the monoarylamine has a substituent group, it is preferable that such an aryl group be an aryl group having 6 to 10 carbon atoms which has a halogen atom as a substituent group, and specifically, bromophenylamine can be exemplified as the monoarylamine having such a substituent group. Here, a fluorine atom, a chlorine atom, a bromine atom, and an iodine atom can be exemplified as the halogen atom.

When the alkyl group configuring the dialkylamine has a substituent group, it is preferable that such an alkyl group be a straight-chain alkyl group or a branched-chain alkyl group having 1 to 9 carbon atoms which has a hydroxyl group or an aryl group as a substituent group, and specifically, diethanolamine and N-methylbenzylamine can be exemplified as the dialkylamine having such a substituent group.

It is preferable that the amine compound be n-propylamine, n-butylamine, n-hexylamine, n-octylamine, n-dodecylamine, n-octadecylamine, sec-butylamine, tert-butylamine, 3-aminopentane, 3-methylbutylamine, 2-aminooctane, 2-ethylhexylamine, 2-phenylethylamine, ethylenediamine, 1,3-diaminopropane, 1,4-diaminobutane, N-methyl-n-hexylamine, diisobutylamine, N-methylbenzylamine, di(2-ethylhexyl)amine, 1,2-dimethyl-n-propylamine, N,N-dimethyl-n-octadecylamine, or N,N-dimethylcyclohexylamine.

(Ammonium Salt Derived from Amine Compound)

In the present invention, the ammonium salt derived from the amine compound is an ammonium salt formed by a reaction between the amine compound and an acid, the acid may be an inorganic acid such as a hydrochloric acid, a sulfuric acid, and a nitric acid, or may be an organic acid such as an acetic acid, and the type of acid is not particularly limited.

A n-propylamine hydrochloride, a N-methyl-n-hexylamine hydrochloride, a N,N-dimethyl-n-octadecylamine hydrochloride, and the like can be exemplified as the ammonium salt derived from the amine compound, but the ammonium salt derived from the amine compound is not limited thereto.

(Ammonium Salt Derived from Ammonia)

In the present invention, the ammonium salt derived from the ammonia is an ammonium salt formed by a reaction between the ammonia and an acid, and here, the same acid as that in the ammonium salt derived from the amine compound can be exemplified as the acid.

Ammonium chloride and the like can be exemplified as the ammonium salt derived from the ammonia, but the ammonium salt derived from the ammonia is not limited thereto.

In the present invention, one type of each of the amine compound, the quaternary ammonium salt, the ammonium salt derived from the amine compound, and the ammonium salt derived from the ammonia may be independently used, or two or more types thereof may be used together. When two or more types of the amine compound, the quaternary ammonium salt, the ammonium salt derived from the amine compound, and the ammonium salt derived from the ammonia are used together, the combination and the ratio thereof can be arbitrarily adjusted.

Then, one type selected from the group consisting of the amine compound, the quaternary ammonium salt, the ammonium salt derived from the amine compound, and the ammonium salt derived from the ammonia may be independently used as the nitrogen-containing compound, or two or more types thereof may be used together. When two or more types of the amine compound, the quaternary ammonium salt, the ammonium salt derived from the amine compound, and the ammonium salt derived from the ammonia are used together, the combination and the ratio thereof can be arbitrarily adjusted.

In the silver ink composition, the blended amount of the nitrogen-containing compound is preferably 0.2 mol to 15 mol, and is more preferably 0.3 mol to 5 mol, per 1 mol of the blended amount of the silver carboxylate.

By setting the blended amount of the nitrogen-containing compound as described above, stability of the silver ink composition is further improved, and the quality of the metal silver is further improved. Further, even when a heating treatment is performed at a high temperature, it is possible to more stably form a conductive layer.

[Alcohol]

It is preferable that the silver ink composition be blended with alcohol, in addition to the silver β-ketocarboxylate (1).

The alcohol may be any one of a straight-chain alcohol, a branched-chain alcohol, and a cyclic alcohol, and when the alcohol is a cyclic alcohol, the alcohol may be either a monocyclic alcohol or a polycyclic alcohol.

In addition, the alcohols may be either a univalent alcohol or a polyvalent alcohol.

Among them, it is preferable that the alcohol be a straight-chain alcohol or a branched-chain alcohol.

Acetylene alcohols denoted by General Formula (2) described below (hereinafter, simply referred to as "acetylene alcohol (2)"), and alcohols having 1 to 7 carbon atoms which do not correspond to the acetylene alcohol (2) (hereinafter, simply referred to as "other alcohols") can be exemplified as the preferred alcohol.

Furthermore, herein, unless otherwise particularly stated, the expression of simple "alcohol" indicates alcohol in general including not only the "other alcohols" but also the "acetylene alcohol (2)".

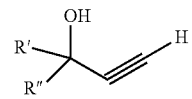

(2)

(In the formula, R' and R" each independently represents an alkyl group having 1 to 20 carbon atoms, or a phenyl group in which one or more hydrogen atoms may be substituted with a substituent group.)

(Acetylene Alcohol (2))

The acetylene alcohol (2) is denoted by General Formula (2) described above.

In the formula, R' and R" each independently represents an alkyl group having 1 to 20 carbon atoms, or a phenyl group in which one or more hydrogen atoms may be substituted with a substituent group.

The alkyl group having 1 to 20 carbon atoms in R' and R" may be any one of a straight-chain alkyl group, a branched-chain alkyl group, and a cyclic alkyl group, and when the alkyl group is a cyclic alkyl group, the alkyl group may be either a monocyclic alkyl group or a polycyclic alkyl group. The same alkyl group as that in R can be exemplified as the alkyl group in R' and R".

A saturated univalent aliphatic hydrocarbon group or an unsaturated univalent aliphatic hydrocarbon group having 1 to 16 carbon atoms, a univalent group in which the aliphatic hydrocarbon group is bonded to an oxygen atom, a fluorine atom, a chlorine atom, a bromine atom, a hydroxyl group, a cyano group, a phenoxy group, and the like can be exemplified as the substituent group with which the hydrogen atoms of the phenyl group in R' and R" may be substituted, and the substituent group with which the hydrogen atoms of the phenyl group in R' and R" may be substituted is identical to the substituent group with which the hydrogen atoms of the phenyl group in R may be substituted. Then, the number of substituent groups and the position thereof are not particularly limited, and when a plurality of substituent groups are used, the plurality of substituent groups may be identical to each other or different from each other.

R' and R" are preferably an alkyl group having 1 to 20 carbon atoms, and are more preferably a straight-chain alkyl group or a branched-chain alkyl group having 1 to 10 carbon atoms.

3,5-dimethyl-1-hexyne-3-ol, 3-methyl-1-butyne-3-ol, and 3-methyl-1-pentyne-3-ol can be exemplified as the preferred acetylene alcohol (2).

When the acetylene alcohol (2) is used, in the silver ink composition, the blended amount of the acetylene alcohol (2) is preferably 0.03 mol to 0.7 mol, and is more preferably 0.05 mol to 0.3 mol, per 1 mol of the blended amount of the silver β-ketocarboxylate (1). By setting the blended amount to be in such a range, the stability of the silver ink composition is further improved.

It is preferable that the other alcohols having 1 to 7 carbon atoms be alcohols having 2 to 5 carbon atoms, and more specifically, a univalent alcohol such as ethanol, 1-propanol, 2-propanol, 1-butanol, 2-butanol, 2-methyl-1-propanol, 2-methyl-2-propanol, and 1-pentanol; and a bivalent alcohol such as ethylene glycol and propylene glycol can be exemplified as the other alcohols.

When the other alcohols are used, in the silver ink composition, the blended amount of the other alcohols is preferably 0.2 parts by mass to 4 parts by mass, and is more preferably 0.5 parts by mass to 2 parts by mass, per 1 part by mass of the blended amount of the silver β-ketocarboxylate (1). By setting the blended amount of the other alcohols to be greater than or equal to the lower limit value described above, the handling properties of the silver ink composition are further improved, and by setting the blended amount of the other alcohols to be less than or equal to the upper limit value described above, it is possible to more efficiently form the metal silver.

One type of alcohol may be independently used, or two or more types of alcohols may be used together. When two or more types of alcohols are used together, the combination and the ratio thereof can be arbitrarily adjusted.

[Reducing Agent]

The silver ink composition may be blended with a reducing agent which does not correspond to the alcohol described above, in addition to the silver β-ketocarboxylate (1). By being blended with the reducing agent, the silver ink composition more easily forms the metal silver, and for example, it is possible to form metal silver having sufficient conductivity even in a heating treatment at a low temperature.

It is preferable that the reducing agent be one or more types of reducing compounds (hereinafter, simply referred to as a "reducing compound") selected from the group consisting of an oxalic acid, hydrazine, and a compound denoted by General Formula (5) described below (hereinafter, simply referred to as a "compound (5)").

(In the formula, $R^{21}$ represents an alkyl group having carbon atoms of less than or equal to 20, an alkoxy group having carbon atoms of less than or equal to 20, or a N,N-dialkylamino group having carbon atoms of less than or equal to 20, a hydroxyl group, or an amino group.)

(Reducing Compound)

The reducing compound is one or more types of compounds selected from the group consisting of an oxalic acid (HOOC—COOH), hydrazine ($H_2N$—$NH_2$), and a compound (the compound (5)) denoted by General Formula (5) described above. That is, the reducing compound to be blended with the silver ink composition may be only one type of reducing compound, or may be two or more types of reducing compounds, and when two or more types of reducing compounds are used, the combination and the ratio thereof can be arbitrarily adjusted.

In the formula, $R^{21}$ represents an alkyl group having carbon atoms of less than or equal to 20, an alkoxy group having carbon atoms of less than or equal to 20, or a N,N-dialkylamino group having carbon atoms of less than or equal to 20, a hydroxyl group, or an amino group.

The alkyl group having carbon atoms of less than or equal to 20 in $R^{21}$ is an alkyl group having 1 to 20 carbon atoms, and may be any one of a straight-chain alkyl group, a branched-chain alkyl group, and a cyclic alkyl group, and the same alkyl group as that in R of General Formula (1) described above can be exemplified as the alkyl group.

The alkoxy group having carbon atoms of less than or equal to 20 in $R^{21}$ is an alkoxy group having 1 to 20 carbon atoms, and a univalent group in which the alkyl group in $R^{21}$ is bonded to an oxygen atom can be exemplified as the alkoxy group.

The N,N-dialkylamino group having carbon atoms of less than or equal to 20 in $R^{21}$ is a N,N-dialkylamino group having 2 to 20 carbon atoms, two alkyl groups bonded to a nitrogen atom may be identical to each other or different from each other, and each of the alkyl groups is an alkyl group having 1 to 19 carbon atoms. Here, the total number of carbon atoms of the two alkyl groups is 2 to 20.

Each of the alkyl groups bonded to the nitrogen atom may be any one of a straight-chain alkyl group, a branched-chain alkyl group, and a cyclic alkyl group, and the same alkyl group as that in R of General Formula (1) described above can be exemplified as the alkyl group except that the number of carbon atoms is 1 to 19.

In the reducing compound, a monohydrate ($H_2N$—$NH_2$—$H_2O$) may be used as the hydrazine.

It is preferable that the reducing compound be a formic acid (H—C(=O)—OH), methyl formate (H—C(=O)—$OCH_3$), ethyl formate (H—C(=O)—$OCH_2CH_3$), butyl formate (H—C(=O)—$O(CH_2)_3CH_3$), propanal (H—C(=O)—$CH_2CH_3$), butanal (H—C(=O)—$(CH_2)_2CH_3$), hexanal (H—C(=O)—$(CH_2)_4CH_3$), formamide (H—C(=O)—$NH_2$), N,N-dimethylformamide (H—C(=O)—N$(CH_3)_2$), or an oxalic acid.

In the silver ink composition, the blended amount of the reducing agent is preferably 0.04 mol to 3.5 mol, and is more preferably 0.06 mol to 2.5 mol, per 1 mol of the blended amount of the silver β-ketocarboxylate (1). By setting the blended amount as described above, the silver ink composition can more easily and more stably form the metal silver.

[Other Components]

The silver ink composition may be blended with other components, in addition to the silver β-ketocarboxylate (1), the nitrogen-containing compound, the alcohol, and the reducing agent.

The other components in the silver ink composition can be arbitrarily selected according to the purpose, and are not particularly limited, a solvent other than the alcohol can be exemplified as preferred other components, and the other components can be arbitrarily selected according to the type or the amount of the blended components.

One type of other component in the silver ink composition may be independently used, or two or more types of other components may be used together. When two or more types of other components are used together, the combination and the ratio thereof can be arbitrarily adjusted.

In the silver ink composition, a ratio of the blended amount of the other components to the total amount of the blended components is preferably less than or equal to 10 mass %, and is more preferably less than or equal to 5 mass %.

All of the components in the silver ink composition may be dissolved, or a part or all of the components in the silver ink composition may not be dissolved, and it is preferable that the components which are not dissolved be uniformly dispersed.

The silver ink composition can be obtained by blending the silver β-ketocarboxylate (1) with components other than the silver β-ketocarboxylate (1).

When the respective components are blended with each other, all of the components may be added and then mixed, the components may be mixed while sequentially adding a part of the components, or the components may be mixed while sequentially adding all of the components, and in the present invention, it is preferable that the reducing agent be blended with the other components by dripping, and surface roughness of the metal silver tends to be further reduced by suppressing a fluctuation in a dripping rate.

A mixing method is not particularly limited, and may be selected from known methods such as a method in which mixing is performed by rotating a stirring element, a stirring blade, or the like, a method in which mixing is performed by using a mixer, and a method in which mixing is performed with ultrasonic waves.

The temperature at the time of blending is not particularly limited insofar as each of the blended components does not deteriorate, but is preferably −5° C. to 60° C.

In addition, a blending time (a mixing time) is also not particularly limited insofar as each of the blended components does not deteriorate, but is preferably 5 minutes to 5 hours.

For example, when the reducing agent is blended with the other components, the obtained blended substance (the silver ink composition) comparatively easily generates heat. Then, when the temperature at the time of blending the reducing agent with the other components is high, the blended substance is in the same state as that at the time of performing a heating treatment with respect to the silver ink composition described below, and thus it is assumed that the formation of the metal silver starts in at least a part of the silver carboxylate by a decomposition acceleration action of the silver carboxylate due to the reducing agent. The silver ink composition containing such metal silver is subjected to a post-treatment in milder conditions than a silver ink composition not containing metal silver, and thus it is possible to form desired metal silver. In addition, even when the blended amount of the reducing agent is sufficiently large, similarly, the post-treatment is performed in mild conditions, and thus it is possible to form desired metal silver. Thus, the conditions for accelerating the decomposition of the silver β-ketocarboxylate (1) are adopted, and thus it is possible to form desired metal silver by performing a heating treatment at a lower temperature or by performing only a drying treatment at ordinary temperature without performing a heating treatment as the post-treatment. In addition, the silver ink composition containing such metal silver can be handled in the same manner as the silver ink composition not containing the metal silver, and in particular, the handling properties do not deteriorate.

The silver ink composition, for example, can be attached onto the substrate 11 (the modification layer 17) by known methods such as a printing method, a coating method, and a dipping method.

A screen printing method, a flexo printing method, an offset printing method, a dip type printing method, an ink jet type printing method, a dispenser type printing method, a gravure printing method, a gravure offset printing method, a pad printing method, and the like can be exemplified as the printing method.

A method using various coaters such as a spin coater, an air knife coater, a curtain coater, a die coater, a blade coater, a roll coater, a gate roll coater, a bar coater, a rod coater, and a gravure coater, a wire bar, and the like can be exemplified as the coating method.

In a step of forming the gate electrode 12, the thickness of the gate electrode 12 can be adjusted by adjusting the amount of the silver ink composition attached onto the substrate 11 (the modification layer 17) or the blended amount of the silver β-ketocarboxylate (1) in the silver ink composition.

When the silver ink composition attached onto the substrate 11 is subjected to a drying treatment, the drying treatment may be performed by a known method, and for example, may be performed under any of ordinary pressure, under reduced pressure, under air blowing conditions, and may be performed either under the atmosphere or under an inert gas atmosphere. The drying temperature is not particularly limited, and either heat drying or ordinary temperature drying may be performed. A method in which drying is performed at 18° C. to 30° C. under the atmosphere can be exemplified as a preferred drying method when a heating treatment is not necessary.

When the silver ink composition attached onto the substrate 11 is subjected to a heating (a calcining) treatment, the conditions may be suitably adjusted according to the type of the blended component of the silver ink composition. In general, it is preferable that a heating temperature be 60° C. to 200° C., and be more preferably 70° C. to 180° C. A heating time may be adjusted according to the heating temperature, and in general, is preferably 0.2 hours to 12 hours, and is more preferably 0.4 hours to 10 hours. The silver β-ketocarboxylate (1) is decomposed at a low temperature, for example, even when a reducing agent or the like which is known in the field is not used, unlike a material for forming metal silver, such as silver oxide. Then, as described above, the silver ink composition can form metal silver at an extremely low temperature compared to the related art, according to such decomposition temperature.

A method for performing the heating treatment with respect to the silver ink composition is not particularly limited, and for example, can be performed by heating using an electric furnace, heating using a thermosensitive thermal head, heating using far infrared irradiation, and the like. In addition, the heating treatment of the silver ink composition may be performed under the atmosphere, or may be performed under an inert gas atmosphere. Then, the heating treatment of the silver ink composition may be performed either under ordinary pressure or under reduced pressure.

EXAMPLES

Hereinafter, the present invention will be described in more detail with reference to specific examples. However, the present invention is not limited to the following examples.

Example 1

<Manufacturing of Transistor>
(Manufacturing of Silver Ink Composition)
Silver 2-methylacetoacetate (1 part by mass), 2-ethylhexylamine (2 parts by mass, a molar amount 3.5 times the silver 2-methylacetoacetate), and methanol (1 part by mass) were stirred at 5° C. to 10° C. for 10 minutes, and thus a silver ink composition was obtained.
(Manufacturing of Transistor)
A transistor was manufactured by the method described with reference to FIG. 4A to FIG. 4F in the following sequence.

A glass substrate having a thickness of 0.7 mm was arranged in an airtight container along with 3-aminopropyltrimethoxysilane (($CH_3O)_3SiCH_2CH_2CH_2NH_2$, "KBM-903" manufactured by Shin-Etsu Chemical Co., Ltd.) which was a silane coupling agent and was heated at 100° C., and steam of the silane coupling agent was in contact with the substrate. Therefore, a modification layer having a thickness of 1 nm was formed on the surface of the substrate.

Next, the silver ink composition manufactured as described above was applied onto the modification layer by a spin coating method (2000 rpm and 20 seconds) and was subjected to a heating treatment at 80° C. for 30 minutes and at 150° C. for 30 minutes, and thus a gate electrode having a thickness of 100 nm was formed on the modification layer.

The surface roughness (Ra) of the gate electrode was measured on the basis of JIS B0601:2001 (ISO4287:1997), and was 4 nm.

Next, a mesitylene solution of benzocyclobutene (hereinafter, simply referred to as "BCB") of which the concentration was 18 mass % was applied onto the gate electrode by a spin coating method and was heated at 50° C. to 250° C. for approximately 10 hours, and thus an insulating layer formed of BCB which had a thickness of 300 nm was formed on the gate electrode.

Next, a semiconductor layer (an organic semiconductor layer) formed of alkyl-DNBDT which had a thickness of 50 nm was formed on the insulating layer by an edge casting method disclosed in "PCT International Publication No. WO2011/040155".

Next, an intermediate layer formed of F6-TNAP which had a thickness of 0.5 nm was formed on the semiconductor layer by a vacuum deposition method.

Next, a source electrode and a drain electrode formed of gold which had a thickness of 30 nm were formed on the intermediate layer such that a channel length of each of the source electrode and the drain electrode was 100 μm by a vacuum deposition method.

Figure 5:
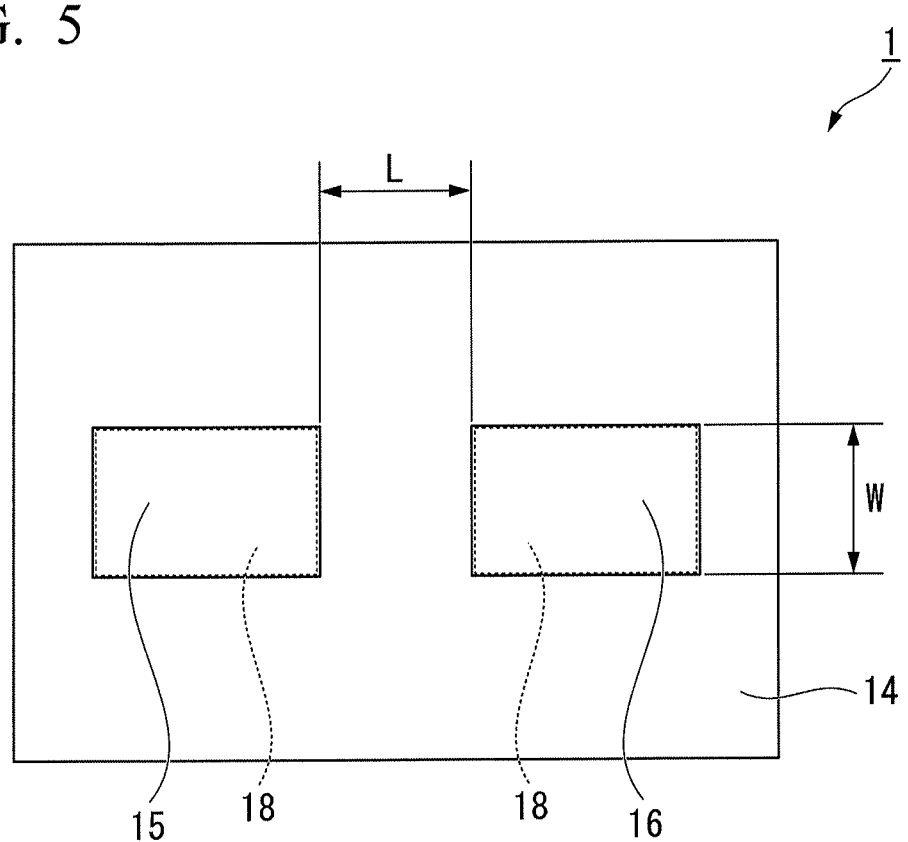
FIG. 5 is a plan view illustrating a transistor of Example 1.

The transistor according to the present invention was manufactured through the steps described above. A plan view of the obtained transistor is illustrated in FIG. 5. In FIG. 5, a reference numeral "W" indicates a channel width.

<Evaluation of Transistor>

Figure 6A:
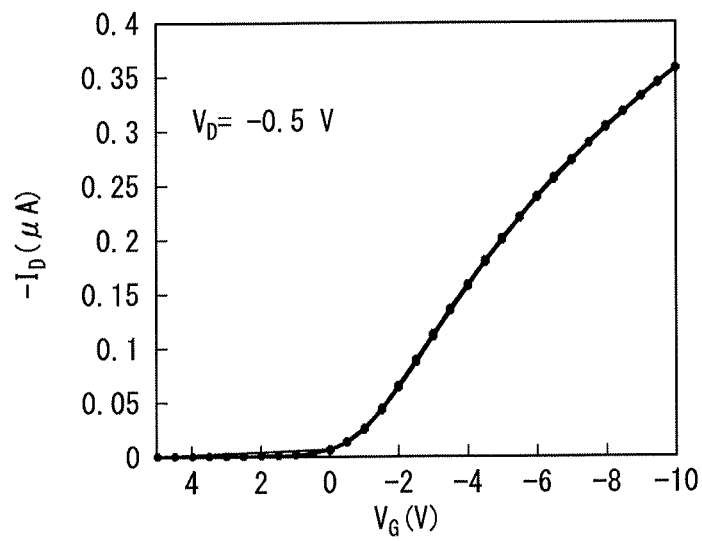
FIG. 6A is a graph illustrating an evaluation result of the transistor of Example 1.
Figure 6B:
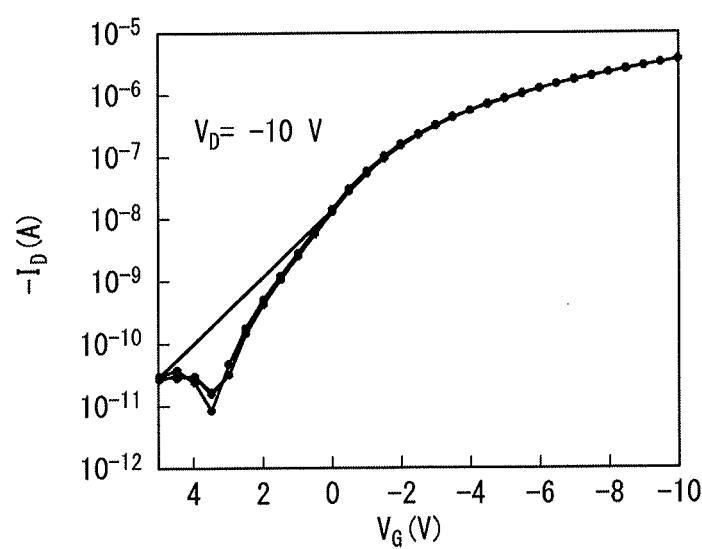
FIG. 6B is a graph illustrating an evaluation result of the transistor of Example 1.
Figure 6C:
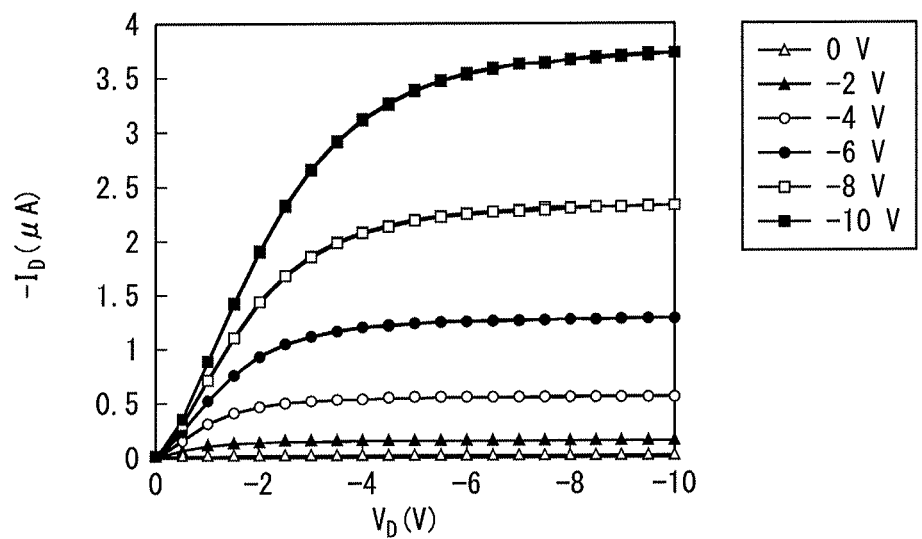
FIG. 6C is a graph illustrating an evaluation result of the transistor of Example 1.

In the obtained transistor, mobility of a carrier, a threshold voltage, an OFF current, and a current ON/OFF ratio were respectively measured. The results are shown in Table 1. In addition, at this time, graphs of a relationship between a drain current $I_D$ and a gate voltage $V_G$ and a relationship between a drain current $I_D$ and a drain voltage $V_D$ (output properties) are illustrated in FIG. 6A to FIG. 6C. FIG. 6A illustrates a relationship between $I_D$ and $V_G$ in a linear region ($V_D$=−0.5 V), FIG. 6B illustrates a relationship between $I_D$ and $V_G$ in a saturated region ($V_D$=−10 V), and FIG. 6C illustrates a relationship between $I_D$ and $V_D$, respectively.

Example 2

A transistor was manufactured by the same method as that in Example 1 except that an insulating layer formed of polyimide (hereinafter, simply referred to as "PI") which had a thickness of 200 nm was formed by a spin coating method instead of the insulating layer formed of BCB which had a thickness of 300 nm.

Figure 7A:
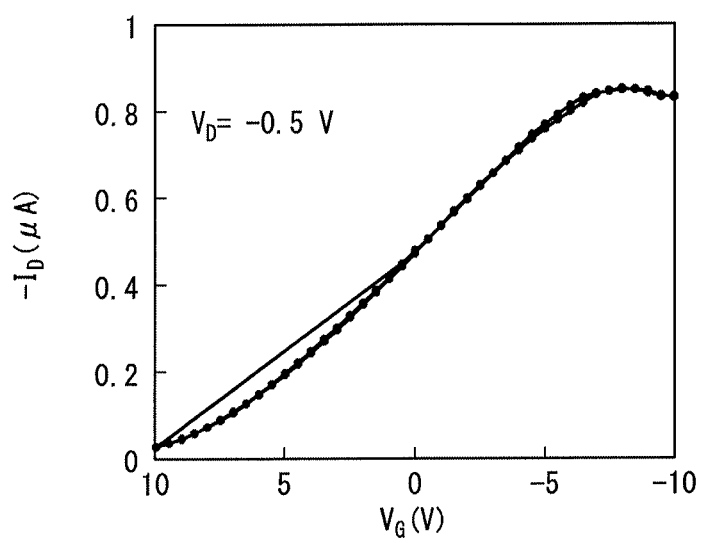
FIG. 7A is a graph illustrating an evaluation result of a transistor of Example 2.
Figure 7B:
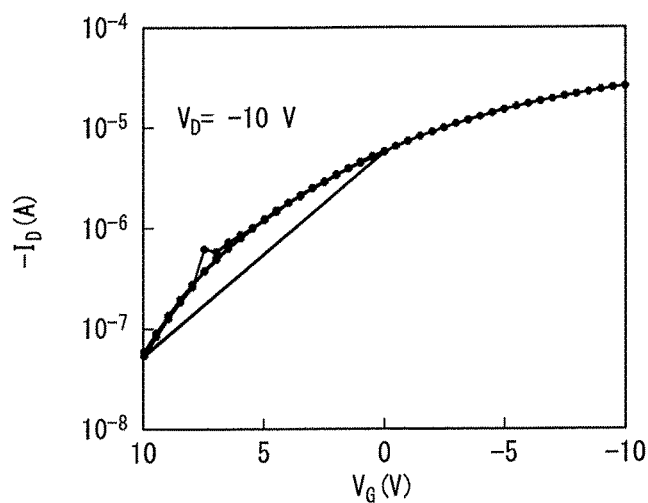
FIG. 7B is a graph illustrating an evaluation result of the transistor of Example 2.
Figure 7C:
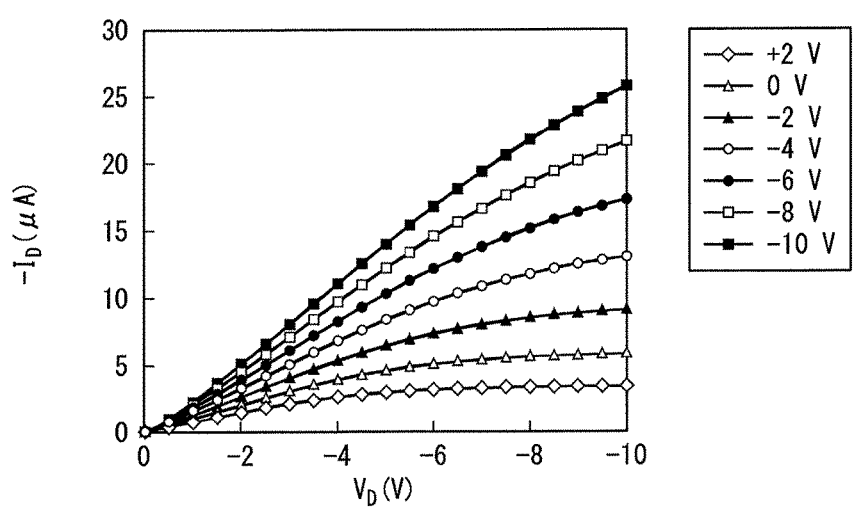
FIG. 7C is a graph illustrating an evaluation result of the transistor of Example 2.

Then, the same evaluation as that in Example 1 was performed with respect to the obtained transistor. The results are shown in Table 1. In addition, at this time, graphs of a relationship between the drain current $I_D$ and the gate voltage $V_G$ and a relationship between the drain current $I_D$ and the drain voltage $V_D$ (output properties) are illustrated in FIG. 7A to FIG. 7C. FIG. 7A illustrates a relationship between $I_D$ and $V_G$ in the linear region ($V_D$=−0.5 V), FIG. 7B illustrates a relationship between $I_D$ and $V_G$ in the saturated region ($V_D$=−10 V), and FIG. 7C illustrates a relationship between $I_D$ and $V_D$, respectively.

Comparative Example 1

A comparative transistor including the gate electrode of the related art was manufactured in the following sequence.

A chromium (Cr) layer having a thickness of 7 nm, a gold (Au) layer having a thickness of 50 nm, and a chromium (Cr) layer having a thickness of 7 nm were laminated on a glass substrate having a thickness of 0.7 mm in this order by a vacuum deposition method, and thus a gate electrode was formed.

In the gate electrode, the surface roughness (Ra) of the chromium layer which was the upper layer was measured on the basis of JIS B0601:2001 (ISO4287:1997), and was 1 nm.

After that, an insulating layer having a thickness of 300 nm, a semiconductor layer (an organic semiconductor layer) having a thickness of 50 nm, an intermediate layer having a thickness of 0.5 nm, and a source electrode and a drain electrode having a thickness of 30 nm were respectively formed on the gate electrode (the chromium layer which was the upper layer) by the same method as that in Example 1.

Figure 8:
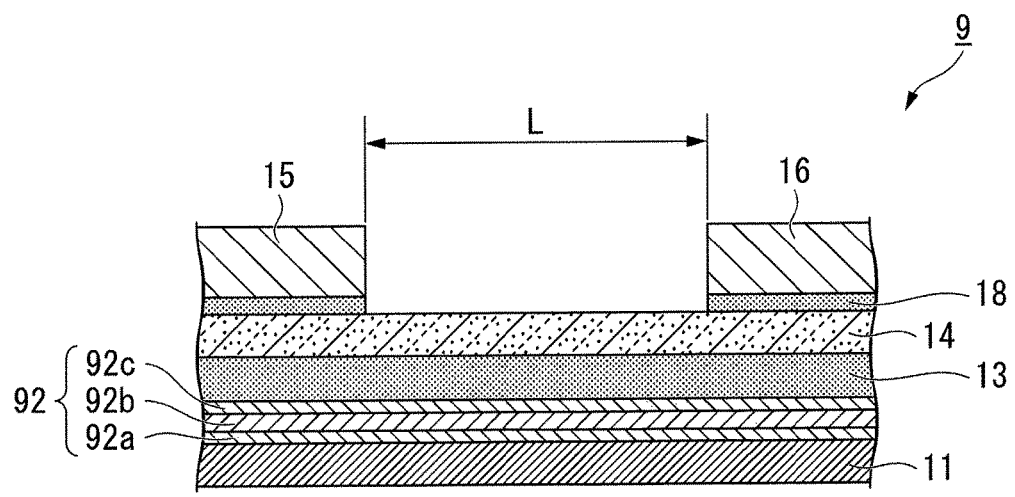
FIG. 8 is a schematic sectional view illustrating a transistor of Comparative Example 1.

A transistor of the related art was manufactured through the steps described above. A schematic sectional view of the obtained transistor is illustrated in FIG. 8. In FIG. 8, a reference numeral "9" indicates a transistor, a reference numeral "92" indicates a gate electrode, reference numerals "92a and 92c" indicate chromium layers, and a reference numeral "92b" indicates a gold layer, respectively. Furthermore, a plan view (not illustrated) of the transistor 9 is identical to that of the transistor 1 of Example 1 (FIG. 5).

Figure 9A:
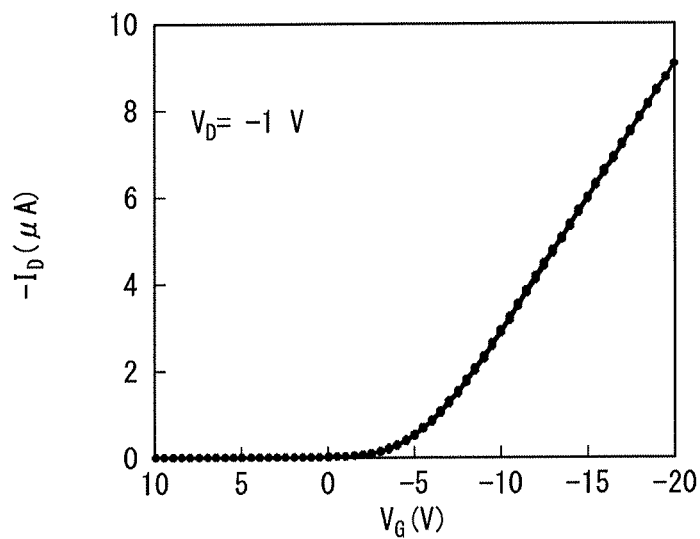
FIG. 9A is a graph illustrating an evaluation result of the transistor of Comparative Example 1.
Figure 9B:
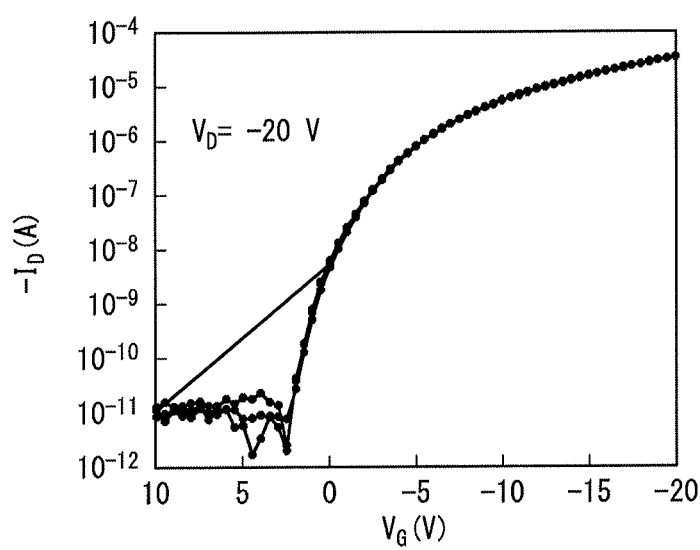
FIG. 9B is a graph illustrating an evaluation result of the transistor of Comparative Example 1.
Figure 9C:
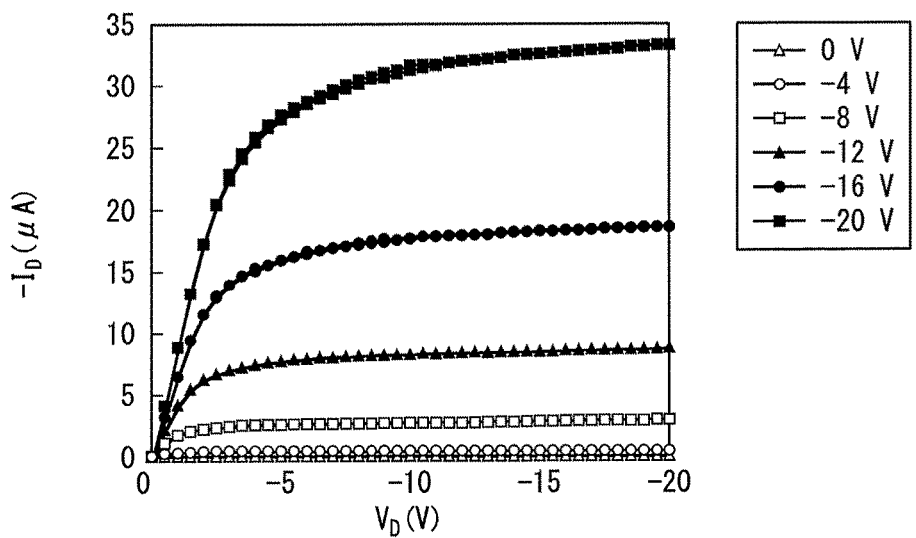
FIG. 9C is a graph illustrating an evaluation result of the transistor of Comparative Example 1.

Then, the same evaluation as that in Example 1 was performed with respect to the obtained transistor. The results are shown in Table 1. In addition, at this time, graphs of a relationship between the drain current $I_D$ and the gate voltage $V_G$ and a relationship between the drain current $I_D$ and the drain voltage $V_D$ (output properties) are illustrated in FIG. 9A to FIG. 9C. FIG. 9A illustrates a relationship between $I_D$ and $V_G$ in the linear region ($V_D$=−1 V), FIG. 9B illustrates a relationship between $I_D$ and $V_G$ in the saturated region ($V_D$=−20 V), and FIG. 9C illustrates a relationship between $I_D$ and $V_D$, respectively.

Comparative Example 2

A transistor was manufactured by the same method as that in Comparative Example 1 except that an insulating layer formed of PI which had a thickness of 200 nm was formed by a spin coating method instead of the insulating layer formed of BCB which had a thickness of 300 nm.

Figure 10A:
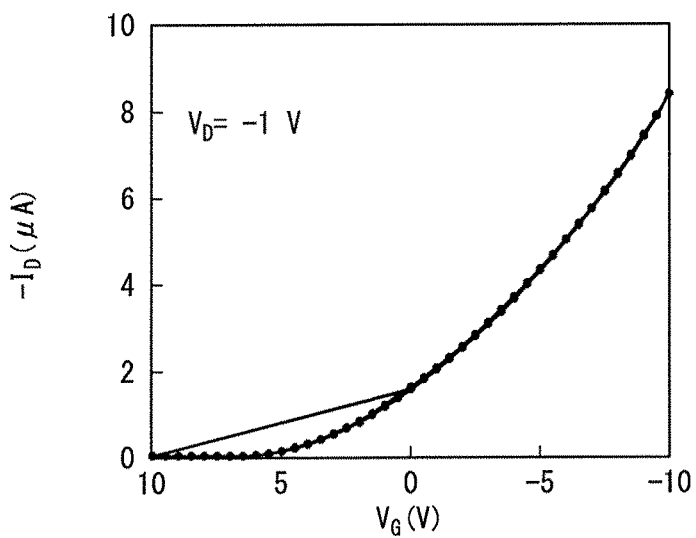
FIG. 10A is a graph illustrating an evaluation result of a transistor of Comparative Example 2.
Figure 10B:
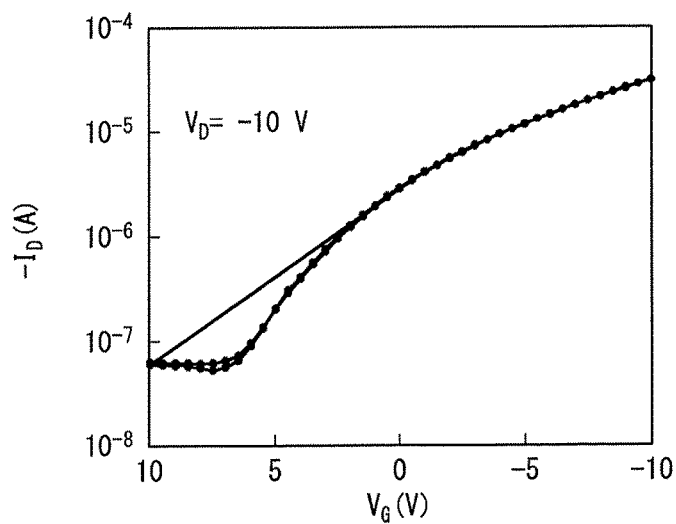
FIG. 10B is a graph illustrating an evaluation result of the transistor of Comparative Example 2.
Figure 10C:
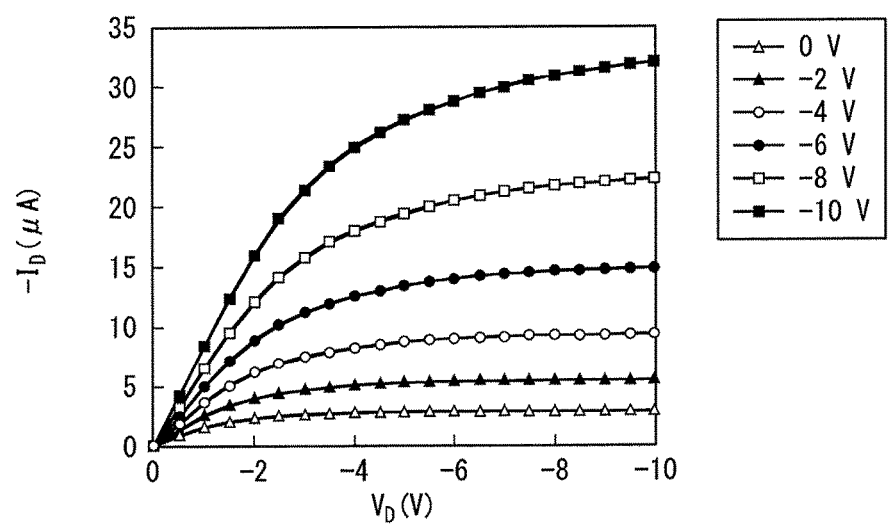
FIG. 10C is a graph illustrating an evaluation result of the transistor of Comparative Example 2.

Then, the same evaluation as that in Example 1 was performed with respect to the obtained transistor. The results are shown in Table 1. In addition, at this time, graphs of a relationship between the drain current $I_D$ and the gate voltage $V_G$ and a relationship between the drain current $I_D$ and the drain voltage $V_D$ (output properties) are illustrated in FIG. 10A to FIG. 10C. FIG. 10A illustrates a relationship between $I_D$ and $V_G$ in the linear region ($V_D$=−1 V), FIG. 10B illustrates a relationship between $I_D$ and $V_G$ in the saturated region ($V_D$=−10 V), and FIG. 10C illustrates a relationship between $I_D$ and $V_D$, respectively.

Comparative Example 3

A comparative transistor including a gate electrode formed of silver nanoparticle ink was manufactured in the following sequence.

Silver nanoparticle ink ("NPS-J" manufactured by Harima Chemicals Group, Inc., an average particle diameter: 12 nm, a solid content: 62 mass % to 67 mass %, and a solvent: tetradecane) was applied onto a glass substrate having a thickness of 0.7 mm by a spin coating method and was subjected to a heating treatment at 150° C. for 30 minutes, and thus a gate electrode having a thickness of 100 nm was formed on the glass substrate.

The surface roughness (Ra) of the gate electrode was measured on the basis of JIS B0601:2001 (ISO4287:1997), and was 21 nm.

After that, an insulating layer having a thickness of 300 nm, a semiconductor layer (an organic semiconductor layer) having a thickness of 50 nm, an intermediate layer having a thickness of 0.5 nm, and a source electrode and a drain electrode having a thickness of 30 nm were respectively formed on the gate electrode by the same method as that in Example 1.

A transistor of the related art was manufactured through the steps described above. A schematic sectional view of the obtained transistor is identical to that of FIG. 1 except that a modification layer is not provided, and a plan view of the transistor is identical to that of FIG. 5 (not illustrated).

Figure 11A:
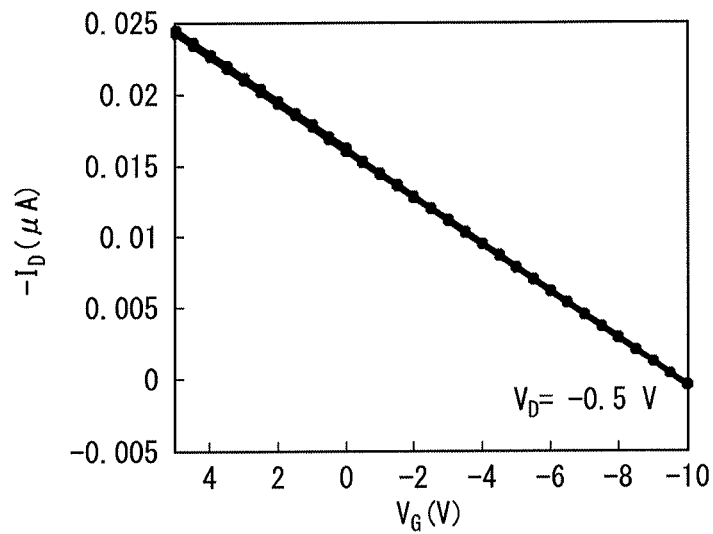
FIG. 11A is a graph illustrating an evaluation result of a transistor of Comparative Example 3.
Figure 11B:
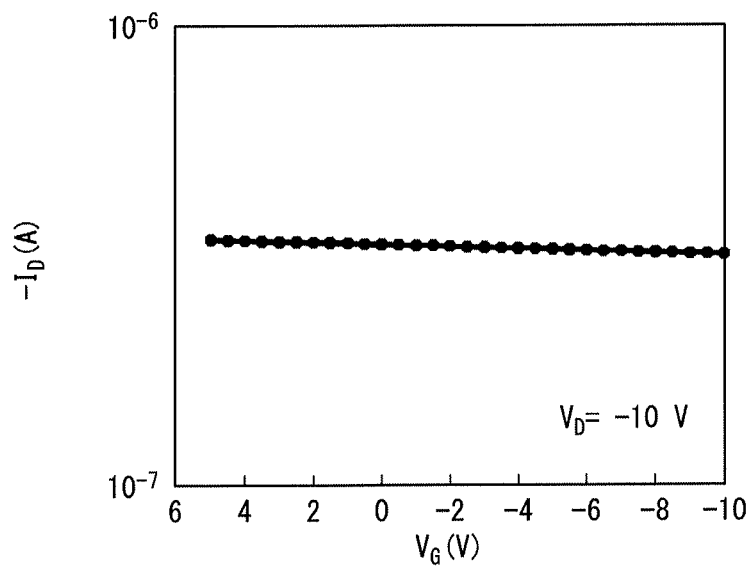
FIG. 11B is a graph illustrating an evaluation result of the transistor of Comparative Example 3.
Figure 11C:
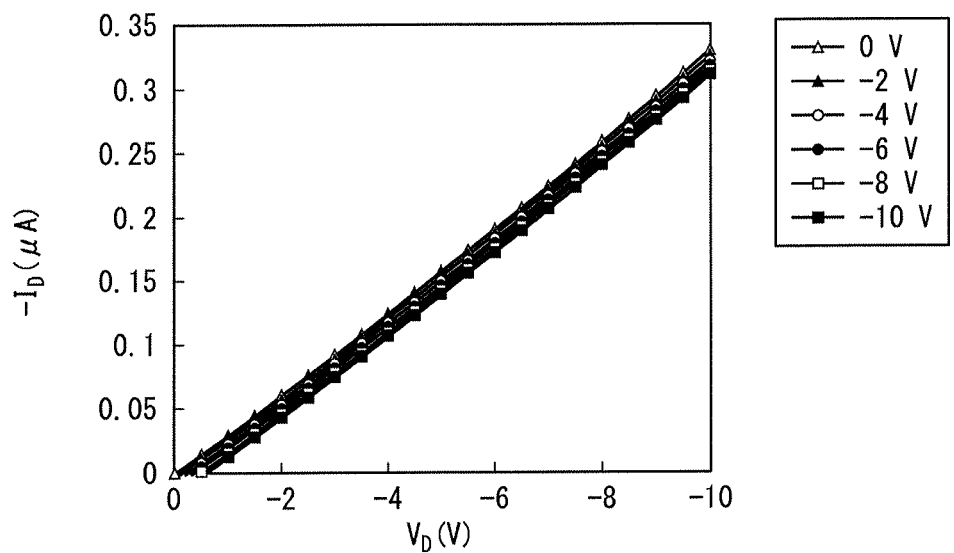
FIG. 11C is a graph illustrating an evaluation result of the transistor of Comparative Example 3.

Then, the same evaluation as that in Example 1 was performed with respect to the obtained transistor. The results are shown in Table 1. In addition, at this time, graphs of a relationship between the drain current $I_D$ and the gate voltage $V_G$ and a relationship between the drain current $I_D$ and the drain voltage $V_D$ (output properties) are illustrated in FIG. 11A to FIG. 11C. FIG. 11A illustrates a relationship between $I_D$ and $V_G$ in the linear region ($V_D$=−0.5 V), FIG. 11B illustrates a relationship between $I_D$ and $V_G$ in the saturated region ($V_D$=−10 V), and FIG. 11C illustrates a relationship between $I_D$ and $V_D$, respectively.

assumed that this was because a gate current was large, and thus the gate electrode passed through the insulating layer to reach the source electrode or the drain electrode.

Example 3

A transistor was manufactured by the same method as that in Example 1 except that an olefin solution (a solution containing a cycloolefin-based thermosetting resin, "ES2110-10" manufactured by Zeon Corporation) was applied onto a gate electrode by a spin coating method (3000 rpm and 30 seconds) and was heated at 150° C. for 60 minutes, and an insulating layer formed of olefin which had a thickness of 300 nm was formed instead of the insulating layer formed of BCB which had a thickness of 300 nm.

Figure 12A:
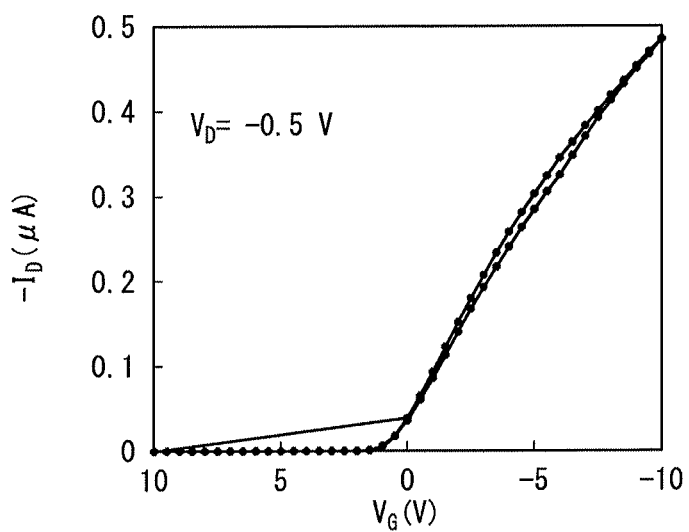
FIG. 12A is a graph illustrating an evaluation result of a transistor of Example 3.
Figure 12B:
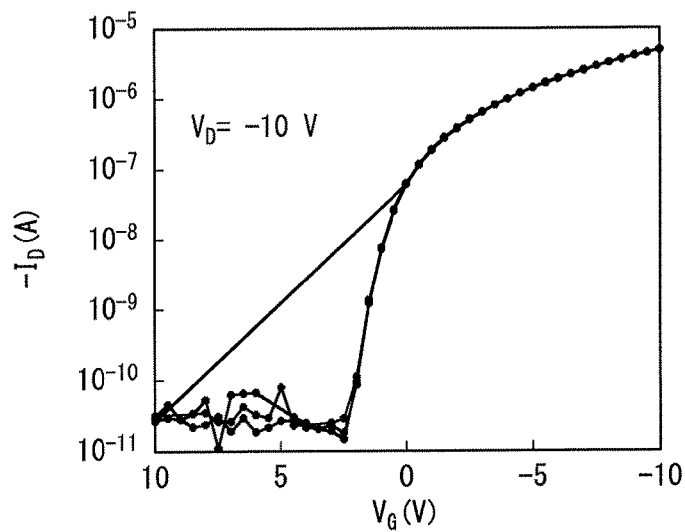
FIG. 12B is a graph illustrating an evaluation result of the transistor of Example 3.
Figure 12C:
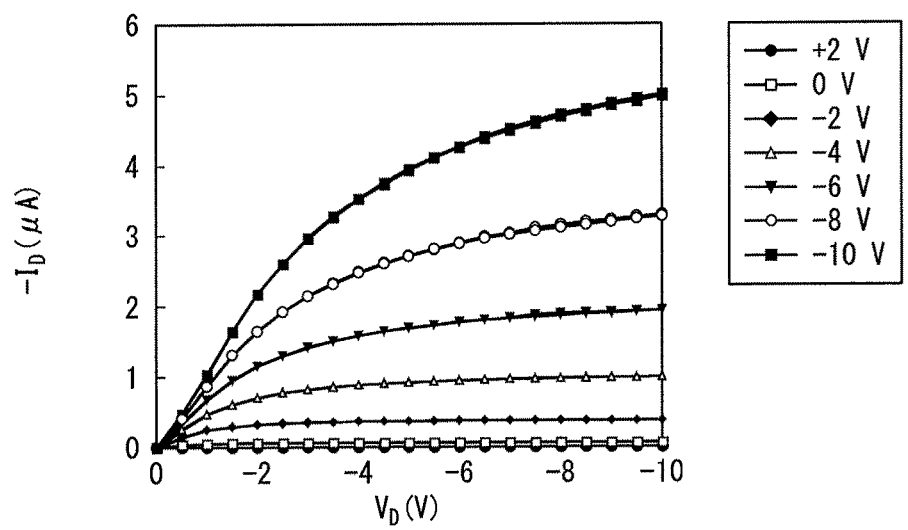
FIG. 12C is a graph illustrating an evaluation result of the transistor of Example 3.

Then, the same evaluation as that of Example 1 was performed with respect to the obtained transistor. The results are shown in Table 2. In addition, at this time, graphs of a relationship between the drain current $I_D$ and the gate voltage $V_G$ and a relationship between the drain current $I_D$ and the drain voltage $V_D$ (output properties) are illustrated in FIG. 12A to FIG. 12C. FIG. 12A illustrates a relationship between $I_D$ and $V_G$ in the linear region ($V_D$=−0.5 V), FIG.

TABLE 1

| | Gate Electrode | | Insulating Layer Material | Channel | Transistor | | | | |
|---|---|---|---|---|---|---|---|---|---|
| | | | | | Mobility of Carrier ($cm^2$/Vs) | | Threshold | OFF | Current ON/OFF |
| | Formation Method | Ra (nm) | (Thickness (nm)) | Length (μm) | Linear Region | Saturated Region | Voltage (V) | Current (A) | Ratio (logA) |
| Example 1 | Application of Silver Ink Composition | 4 | BCB (300) | 100 | 5.0 | 4.5 | 3 | $1 \times 10^{-11}$ | 6 |
| Example 2 | Application of Silver Ink Composition | 4 | PI (200) | 100 | 5.0 | — | 10 | $1 \times 10^{-7}$ | 2 |
| Comparative Example 1 | Vacuum Deposition of Cr/Au/Cr | 1 | BCB (300) | 100 | 4.5 | 2.2 | 3 | $1 \times 10^{-11}$ | 6 |
| Comparative Example 2 | Vacuum Deposition of Cr/Au/Cr | 1 | PI (200) | 100 | 3.5 | — | 7 | $1 \times 10^{-8}$ | 3 |
| Comparative Example 3 | Application of Silver Nanoparticle Ink | 21 | BCB (300) | 100 | | | Inoperable | | |

As it is obvious from Table 1, in the transistors of Examples 1 and 2, the surface roughness of the gate electrode which was formed by using the silver β-ketocarboxylate (1) under atmosphere by a coating method was low, and the mobility of the carrier was higher than the transistors of Comparative Examples 1 and 2 using the gate electrode which was formed by vacuum deposition and had surface roughness lower than or equal to the surface roughness of the gate electrode of transistors of Examples 1 and 2. In addition, the threshold voltage was in a suitable numerical range, the OFF current was low, and the current ON/OFF ratio was large. Further, as illustrated in FIG. 6A to FIG. 6C and FIG. 7A to FIG. 7C, all of $I_D$, $V_G$, $I_D$, and $V_D$ had a clear mutual relationship. Thus, the transistors of Examples 1 and 2 had excellent properties.

In contrast, in the transistor of Comparative Example 3, the surface roughness of the gate electrode which was formed by using silver nanoparticles under atmosphere by a coating method was high. In addition, the transistor of Comparative Example 3 was not operated, and it was 12B illustrates a relationship between $I_D$ and $V_G$ in the saturated region ($V_D$=−10 V), and FIG. 12C illustrates a relationship between $I_D$ and $V_D$, respectively.

Comparative Example 4

A silicon wafer (N type highly doped silicon in which the surface was subjected to thermal oxidation, and thus a silicon dioxide layer having a thickness of 100 nm was formed) having a two-layer structure was used, the silicon dioxide layer was used as a part of an insulating layer, and the N type silicon layer was used as both of a substrate and a gate electrode. The surface roughness (Ra) of the silicon dioxide layer was measured on the basis of JIS B0601:2001 (ISO4287:1997), and was 0.1 nm.

Next, an insulating layer formed of olefin which had a thickness of 300 nm was formed on the silicon dioxide layer by the same method as that in Example 3 using a spin coating method.

After that, a semiconductor layer (an organic semiconductor layer) having a thickness of 50 nm, an intermediate layer having a thickness of 0.5 nm, and a source electrode and a drain electrode having a thickness of 30 nm were respectively formed by the same method as that in Example 3.

A transistor of the related art was manufactured through the steps described above.

Figure 13A:
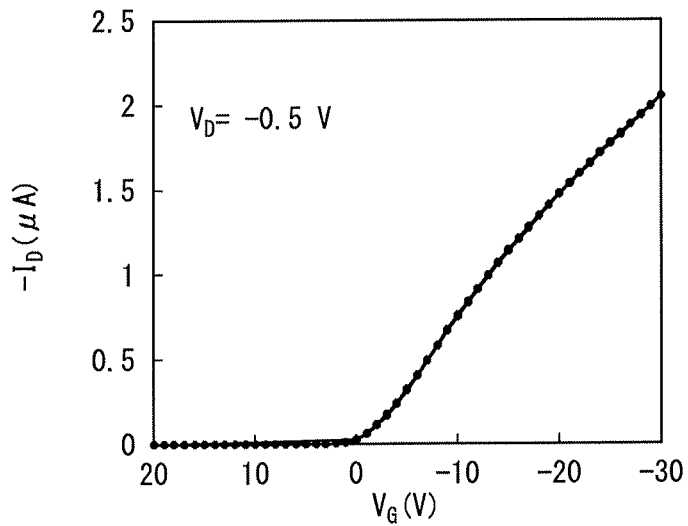
FIG. 13A is a graph illustrating an evaluation result of a transistor of Comparative Example 4.
Figure 13B:
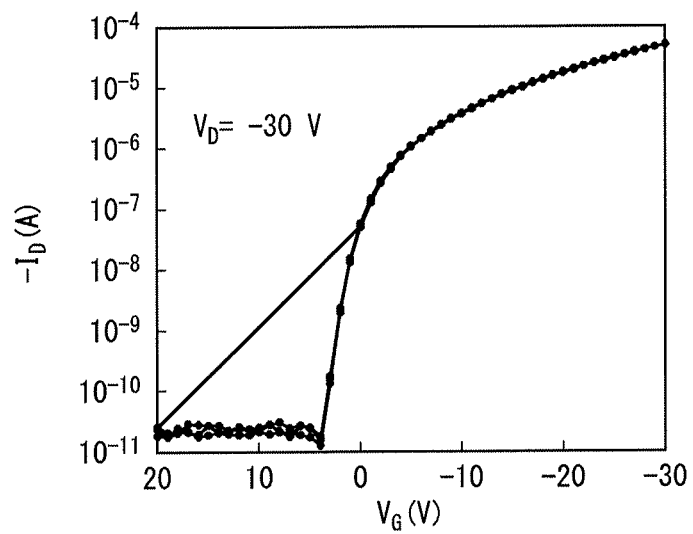
FIG. 13B is a graph illustrating an evaluation result of the transistor of Comparative Example 4.
Figure 13C:
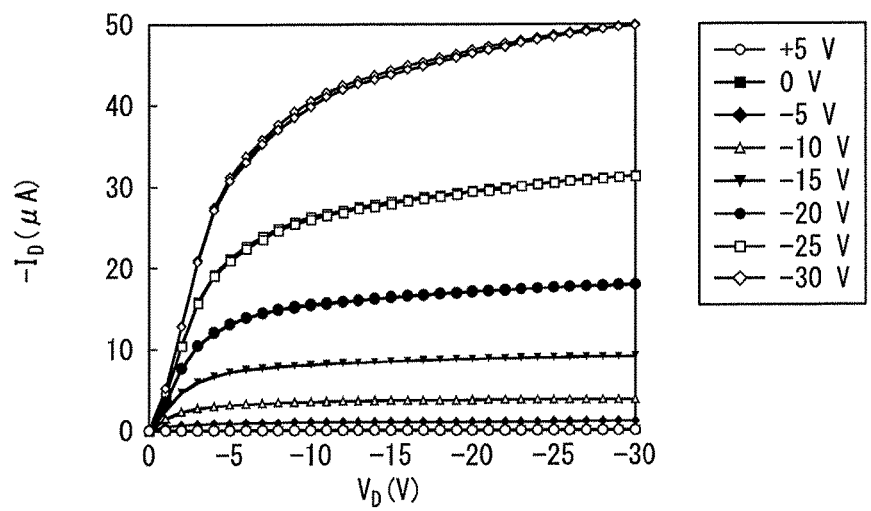
FIG. 13C is a graph illustrating an evaluation result of the transistor of Comparative Example 4.

Then, the same evaluation as that of Example 1 was performed with respect to the obtained transistor. The results are shown in Table 2. In addition, at this time, graphs of a relationship between the drain current $I_D$ and the gate voltage $V_G$ and a relationship between the drain current $I_D$ and the drain voltage $V_D$ (output properties) are illustrated in FIG. 13A to FIG. 13C. FIG. 13A illustrates a relationship between $I_D$ and $V_G$ in the linear region ($V_D$=−0.5 V), FIG. 13B illustrates a relationship between $I_D$ and $V_G$ in the saturated region ($V_D$=−30 V), FIG. 13C illustrates a relationship between $I_D$ and $V_D$, respectively.

TABLE 2

|  | Gate Electrode | | Insulating Layer Material | Channel | Mobility of Carrier ($cm^2/Vs$) | | Transistor Threshold | OFF | Current ON/OFF |
| --- | --- | --- | --- | --- | --- | --- | --- | --- | --- |
|  | Formation Method | Ra (nm) | (Thickness (nm)) | Length (μm) | Linear Region | Saturated Region | Voltage (V) | Current (A) | Ratio (logA) |
| Example 3 | Application of Silver Ink Composition | 4 | Olefin (300) | 100 | 4.0 | 3.0 | 4 | 1 × 10$^{-11}$ | 5 |
| Comparative Example 4 | Silicon Wafer | (0.1) | Olefin (300) + SiO$_2$ (100) | 100 | 4.0 | 4.0 | 3 | 1 × 10$^{-11}$ | 6 |

As it is obvious from Table 2, as with the transistors of Examples 1 and 2, in the transistor of Example 3, the surface roughness of the gate electrode which was formed by using the silver β-ketocarboxylate (1) under atmosphere by a coating method was low, and the mobility of the carrier was high. In addition, the threshold voltage was in a suitable numerical range, the OFF current was low, and the current ON/OFF ratio was large. Further, as illustrated in FIG. 12A to FIG. 12C, all of $I_D$ and $V_G$, and $I_D$ and $V_D$ had a clear mutual relationship. Thus, the transistor of Example 3 had excellent properties.

The transistor of Comparative Example 4 also had the same properties as those of the transistor of Example 3.

Example 4

<Manufacturing of Transistor>
(Manufacturing of Silver Ink Composition)
Silver 2-methylacetoacetate (1 parts by mass), 2-ethylhexylamine (2 parts by mass, a molar amount 3.5 times the silver 2-methylacetoacetate), methanol (1 parts by mass), and 3,5-dimethyl-1-hexyne-3-ol (0.04 parts by mass, a molar amount 0.07 times the silver 2-methylacetoacetate) were stirred at 5° C. to 10° C. for 10 minutes, and thus a silver ink composition was obtained.
(Manufacturing of Transistor)
A transistor illustrated in FIG. 3 was manufactured in the following sequence.

The silver ink composition manufactured as described above was applied onto a polyethylene naphthalate substrate (a PEN substrate) having a thickness of 100 mm by a spin coating method (2000 rpm and 20 seconds) and was subjected to a heating treatment at 100° C. for 30 minutes and at 150° C. for 30 minutes, and thus a silver layer having a thickness of 100 nm was formed on the PEN substrate.

Next, the formed silver layer was patterned into the shape of a line having a thickness of 100 nm and a width of 10 μm by photolithography and etching, and thus a gate electrode was formed.

At this time, in the photolithography, "S1805" manufactured by Shipley Company L.L.C which was used as a resist was applied onto the silver layer by a spin coating method (1000 rpm and 30 seconds) and was heated at 90° C. for 10 minutes, and then was exposed at 100 mW/cm$^2$, was developed for 1 minute by using a developing solution ("NMD-3" manufactured by TOKYO OHKA KOGYO CO., LTD.), and was heated at 120° C. for 20 minutes. Therefore, a resist pattern was formed.

In addition, in the etching, the exposed silver layer was removed by using a silver etching solution ("SEA-1" manufactured by KANTO CHEMICAL CO., INC.), and the remaining resist was removed by acetone washing. Therefore, a gate electrode was formed.

The surface roughness (Ra) of the gate electrode was measured on the basis of JIS B0601:2001 (ISO4287:1997), and was 4 nm.

Next, an olefin solution ("ES2110-10" manufactured by Zeon Corporation) was applied onto the surface of a laminated product obtained as described above in which the gate electrode was laminated (the surface of the PEN substrate and the gate electrode) on the PEN substrate by a spin coating method (3000 rpm and 30 seconds) and was heated at 150° C. for 60 minutes, and thus an insulating layer formed of olefin which had a thickness of 400 nm was formed.

Next, a mask was disposed on the insulating layer such that a predetermined pattern could be formed, a semiconductor formed of alkyl-DNBDT was subjected to vapor deposition at 140° C., and the mask was removed. Therefore, a semiconductor layer (an organic semiconductor layer) having a thickness of 25 nm was formed on the insulating layer.

Next, gold was vapor-deposited on the surface of a laminated product obtained as described above in which the gate electrode, the insulating layer, and the semiconductor layer were laminated on the PEN substrate in this order (the surface of the insulating layer and the semiconductor layer), and thus a gold layer was formed.

Next, the formed gold layer was patterned such that the channel length was 5 μm by photolithography and etching, and thus a source electrode and a drain electrode were formed.

At this time, in the photolithography, "OSCOR2312" manufactured by Orthogonal Inc. was used as a resist and was applied onto the gold layer by a spin coating method (2000 rpm and 30 seconds), was heated at 60° C. for 20 minutes, and then was exposed at 300 mW/cm², was heated at 60° C. for 20 minutes, and was developed by using a developing solution ("Novec7300" manufactured by 3M Company). Therefore, a resist pattern was formed.

In addition, in the etching, the exposed gold layer was removed by using an etching solution ("AurumS-50790" manufactured by KANTO CHEMICAL CO., INC.), the remaining resist was removed by a washing solution ("Novec7100" manufactured by 3M Company), and a source electrode and a drain electrode formed of gold which had a thickness of 50 nm were respectively formed. Therefore, a transistor was manufactured.

<Evaluation of Transistor>

Figure 14A:
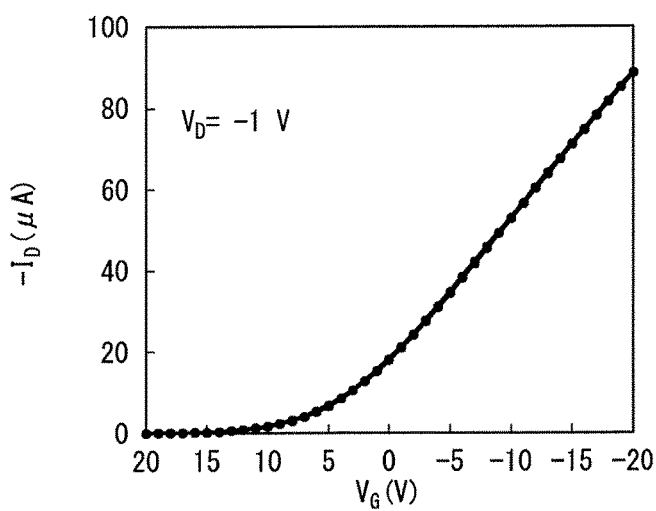
FIG. 14A is a graph illustrating an evaluation result of a transistor of Example 4.
Figure 14B:
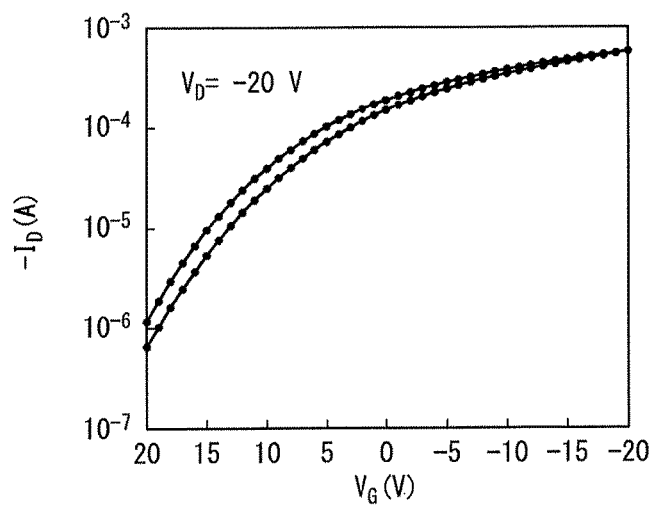
FIG. 14B is a graph illustrating an evaluation result of the transistor of Example 4.
Figure 14C:
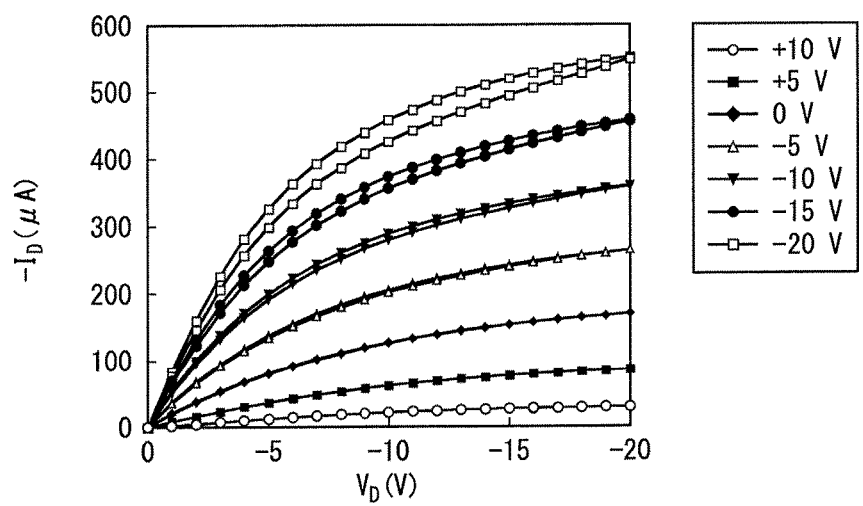
FIG. 14C is a graph illustrating an evaluation result of the transistor of Example 4.

The same evaluation as that of Example 1 was performed with respect to the obtained transistor. The results are shown in Table 3. In addition, at this time, graphs of a relationship between the drain current ID and the gate voltage VG and a relationship between the drain current ID and the drain voltage VD (output properties) are illustrated in FIG. 14A to FIG. 14C. FIG. 14A illustrates a relationship between ID and VG in the linear region ($V_D$=-1 V), FIG. 14B illustrates a relationship between ID and VG in the saturated region (VD=-20 V), and FIG. 14C illustrates a relationship between ID and VD, respectively.

Figure 15:
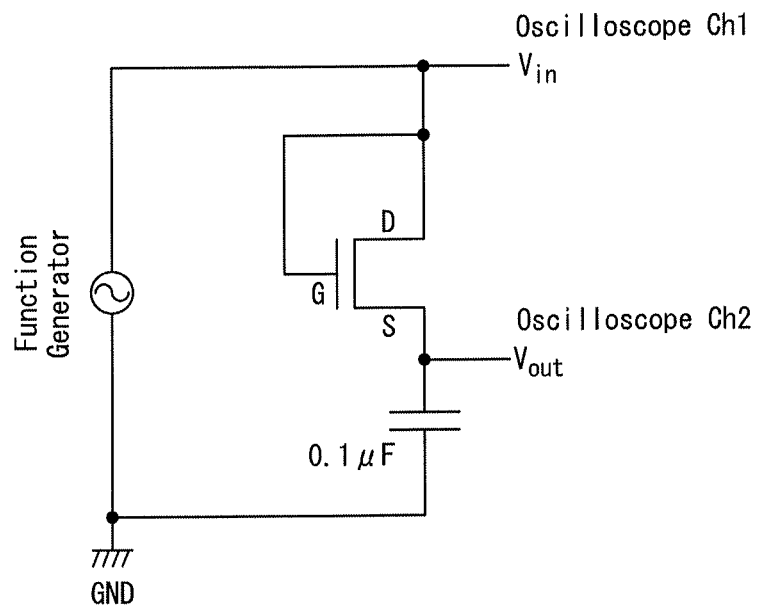
FIG. 15 is a diagram of a circuit manufactured by using the transistor of Example 4 in order to evaluate the transistor of Example 4.

Further, a circuit having a configuration illustrated in FIG. 15 was manufactured by using the obtained transistor, and the maximum frequency at the time of performing rectification was obtained. The details are as follows. Furthermore, in FIG. 15, reference numerals "G, D, and S" respectively indicate the gate electrode, the drain electrode, and the source electrode of the transistor obtained as described above.

Figure 16:
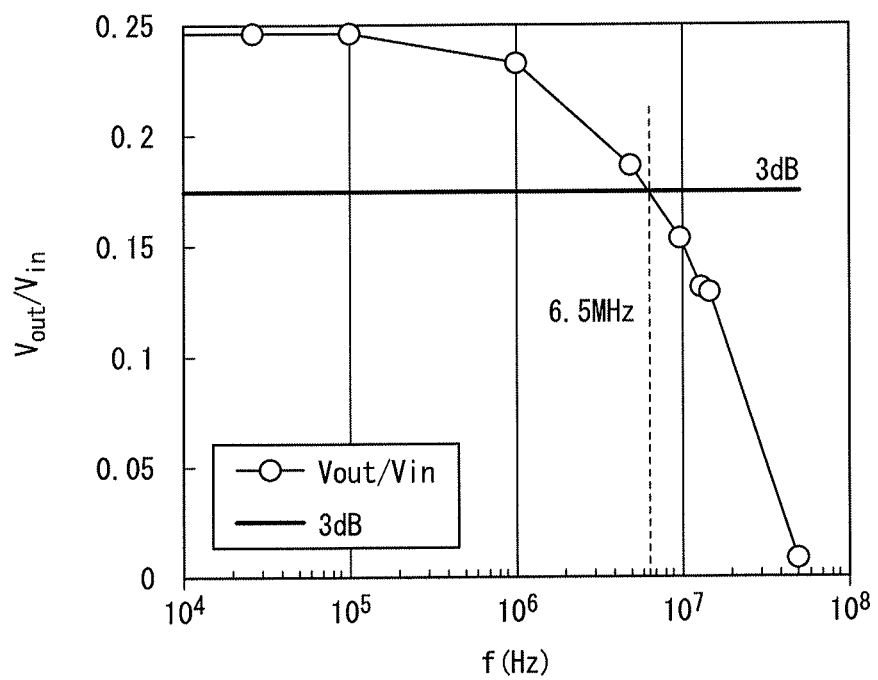
FIG. 16 is a graph for obtaining the maximum frequency at the time of performing rectification in the circuit manufactured by using the transistor of Example 4.

In the circuit, the frequency of an input signal (Function Generator) was changed, $V_{in}$ at each frequency (the minimum value of an input alternating current voltage) and $V_{out}$ at each frequency (a direct current voltage output (rectified) to a capacitor) were measured, $V_{out}/V_{in}$ was calculated, was plotted on a graph, and a curve was obtained. Then, a value corresponding to 3 dB of the value of $V_{out}/V_{in}$ (approximately 70% of the value) which was constant on a low frequency side was calculated, a frequency intersecting with the value was obtained, and the frequency was set as the maximum frequency at the time of performing rectification. The results are shown in Table 3. In addition, a graph obtained at this time is illustrated in FIG. 16.

Example 5

<Manufacturing of Transistor>

The same silver ink composition as that in Example 4 was applied onto a glass substrate having a thickness of 0.7 mm by a spin coating method (1000 rpm and 20 seconds) and was subjected to a heating treatment at 100° C. for 30 minutes and at 150° C. for 30 minutes, and thus a silver layer having a thickness of 200 nm was formed on the glass substrate.

Next, the formed silver layer was patterned into the shape of a line having a thickness of 200 nm and a width of 10 μm by photolithography and etching, and thus a gate electrode was formed. At this time, the photolithography and the etching were performed by the same method as that in Example 4.

The surface roughness (Ra) of the gate electrode was measured on the basis of JIS B0601:2001 (ISO4287:1997), and was 4 nm.

Next, an alumina layer having a thickness of 130 nm was formed on the surface of a laminated product obtained as described above in which the gate electrode was laminated on the glass substrate (the surface of the glass substrate and the gate electrode) by an ALD method. The ALD method was performed by respectively using triethyl aluminum gas as adsorption gas and $H_2O$ gas as reactive gas, by introducing nitrogen gas into a reaction chamber as carrier gas, and by using nitrogen gas as purge gas. The temperature at the time of forming the film (a film formation temperature) was 150° C. When the nitrogen gas was used as the carrier gas, the flow rate of the nitrogen gas was 300 sccm, and when the nitrogen gas was used as the purge gas, the flow rate of the nitrogen gas was 1500 sccm. The pressure in the reaction chamber was 40 Pa. The introduction time of the triethyl aluminum gas was 0.3 seconds, the introduction time of the $H_2O$ gas was 0.3 seconds, and the introduction time of the purge gas (the nitrogen gas) was 1 second.

Further, an olefin solution ("ES2110-10" manufactured by Zeon Corporation) was applied onto the alumina layer by a spin coating method (2000 rpm and 30 seconds) and was heated at 150° C. for 60 minutes, and thus an olefin layer having a thickness of 30 nm was formed. As described above, an insulating layer formed by laminating the alumina layer and the olefin layer in this order from the substrate side was formed.

Next, a semiconductor layer (an organic semiconductor layer) having a thickness of 25 nm was formed on the insulating layer by the same method as that in Example 4, and a source electrode and a drain electrode formed of gold which had a thickness of 50 nm were respectively formed on the semiconductor layer. Therefore, a transistor was manufactured.

<Evaluation of Transistor>

Figure 17A:
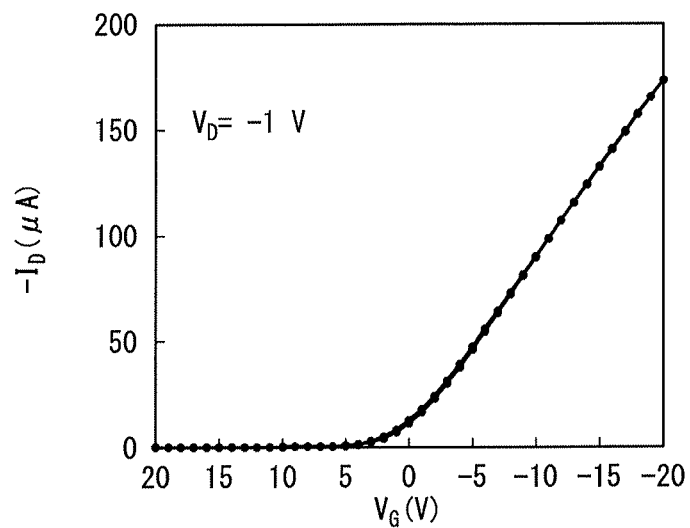
FIG. 17A is a graph illustrating an evaluation result of a transistor of Example 5.
Figure 17B:
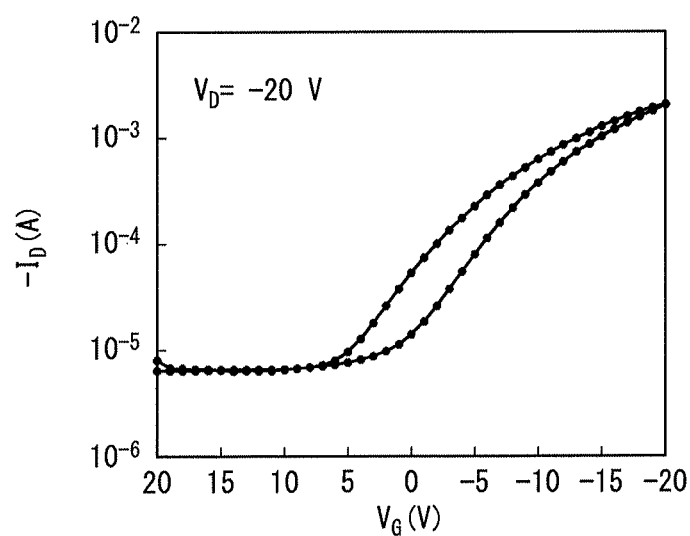
FIG. 17B is a graph illustrating an evaluation result of the transistor of Example 5.
Figure 17C:
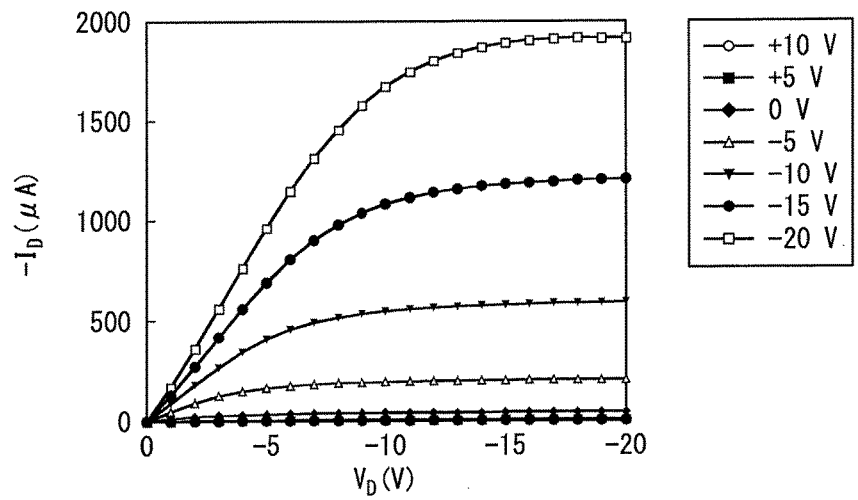
FIG. 17C is a graph illustrating an evaluation result of the transistor of Example 5.
Figure 18:
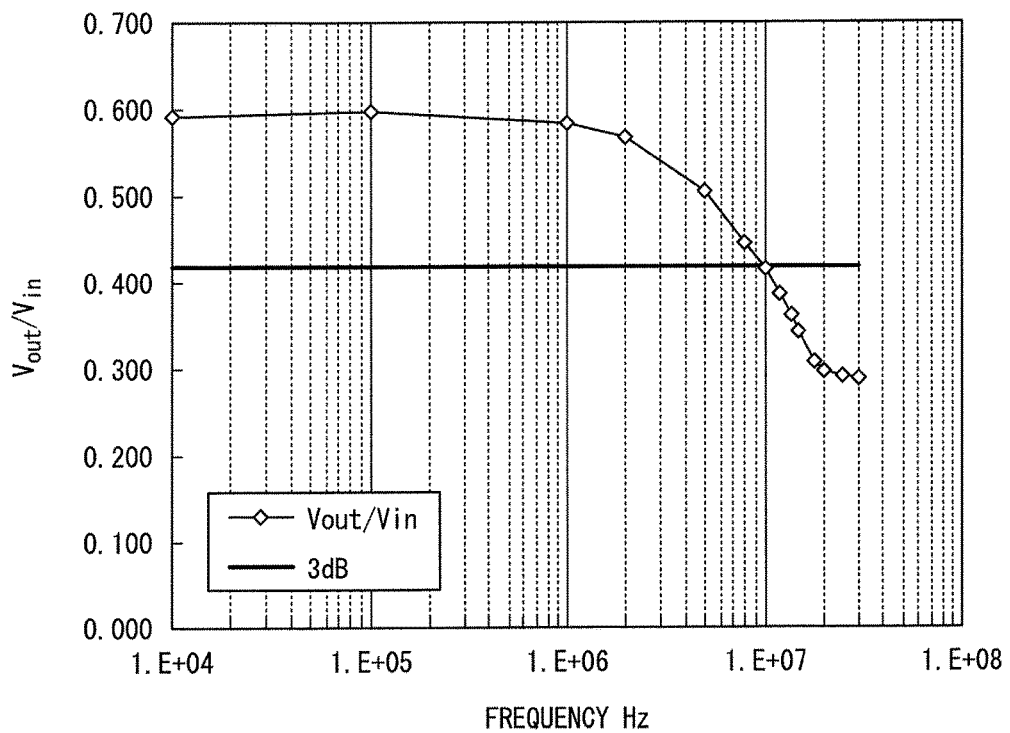
FIG. 18 is a graph for obtaining the maximum frequency at the time of performing rectification in the circuit manufactured by using the transistor of Example 5.

The same evaluation as that of Example 4 was performed with respect to the obtained transistor. The results are shown in Table 3. In addition, at this time, graphs of a relationship between the drain current ID and the gate voltage VG and a relationship between the drain current ID and the drain voltage VD (output properties) are illustrated in FIG. 17A to FIG. 17C. FIG. 17A illustrates a relationship between ID and VG in the linear region ($V_D$=-1 V), FIG. 17B illustrates a relationship between ID and VG in the saturated region (VD=-20 V), and FIG. 17C illustrates a relationship between ID and VD, respectively. In addition, a graph obtained when the maximum frequency at the time of performing rectification is obtained is illustrated in FIG. 18.

Example 6

A transistor was manufactured by the same method as that in Example 5 except that a resist pattern was changed by photolithography, and a source electrode and a drain electrode having a channel length of 2 μm were formed.

Figure 19A:
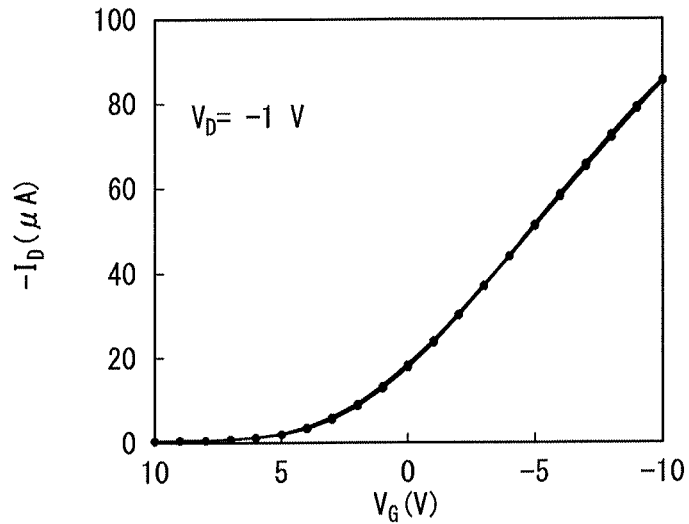
FIG. 19A is a graph illustrating an evaluation result of a transistor of Example 6.
Figure 19B:
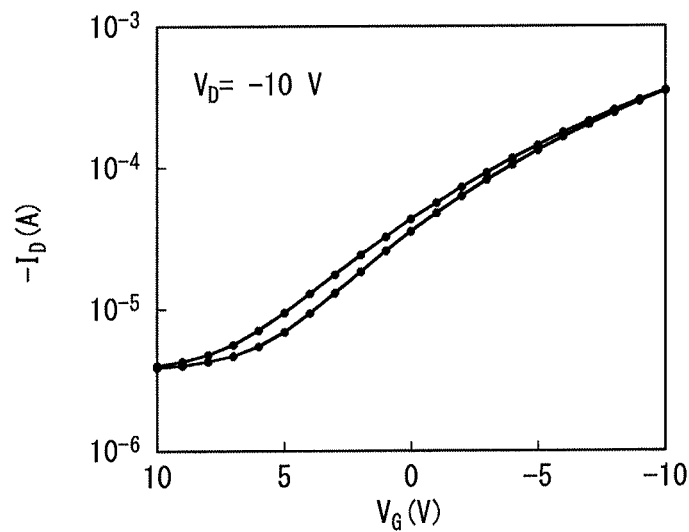
FIG. 19B is a graph illustrating an evaluation result of the transistor of Example 6.
Figure 19C:
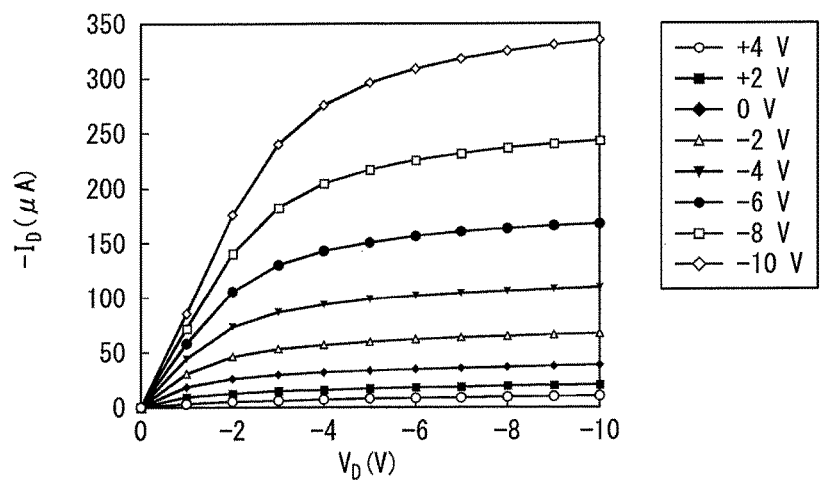
FIG. 19C is a graph illustrating an evaluation result of the transistor of Example 6.
Figure 20:
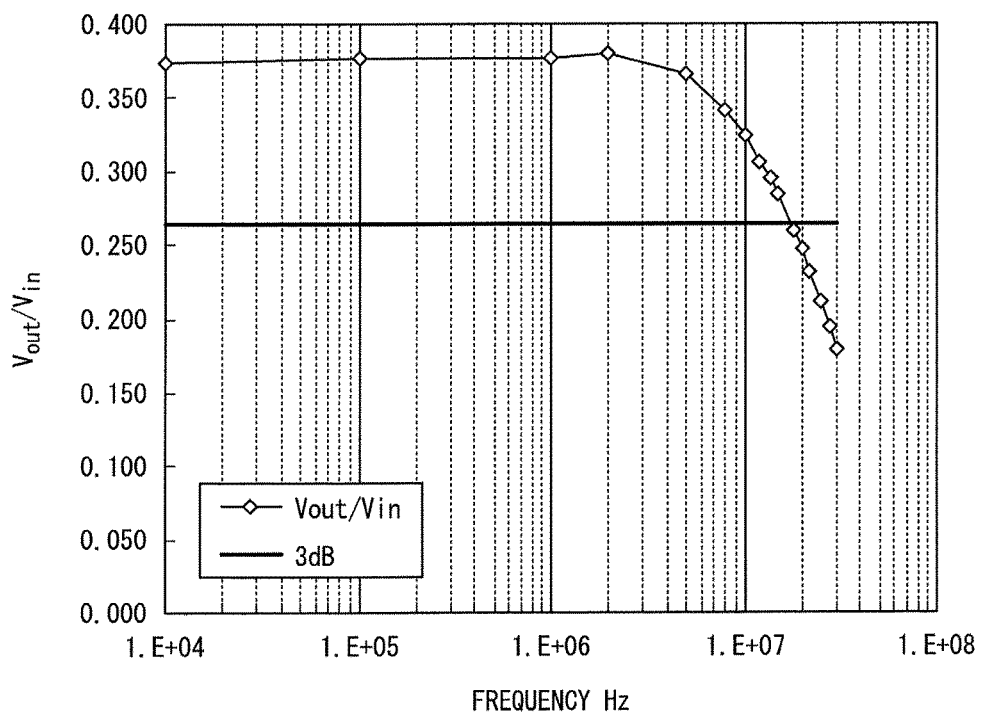
FIG. 20 is a graph for obtaining the maximum frequency at the time of performing rectification in the circuit manufactured by using the transistor of Example 6.

Then, the same evaluation as that in Example 4 was performed with respect to the obtained transistor. The results are shown in Table 3. In addition, at this time, graphs of a relationship between the drain current ID and the gate voltage VG and a relationship between the drain current ID and the drain voltage VD (output properties) are illustrated in FIG. 19A to FIG. 19C. FIG. 19A illustrates a relationship between ID and VG in the linear region ($V_D$=-1 V), FIG. 19B illustrates a relationship between ID and VG in the saturated region (VD=-10 V), and FIG. 19C illustrates a relationship between ID and VD, respectively. In addition, a graph obtained when the maximum frequency at the time of performing rectification is obtained is illustrated in FIG. 20.

Example 7

A transistor was manufactured by the same method as that in Example 4 except that a gate electrode having a thickness of 40 nm was formed by setting the conditions of a spin coating method at the time of forming a silver layer to be 4000 rpm and 20 seconds instead of 2000 rpm and 20 seconds, a resist pattern in the photolithography was changed, and a source electrode and a drain electrode having a channel length of 2 μm were formed.

Figure 21A:
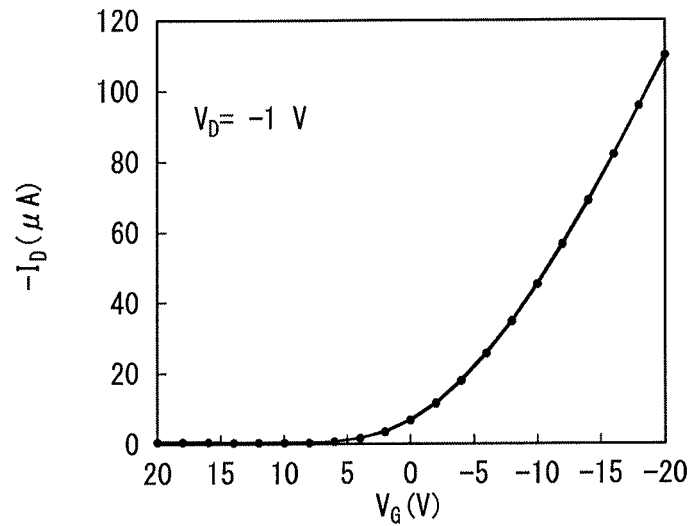
FIG. 21A is a graph illustrating an evaluation result of a transistor of Example 7.
Figure 21B:
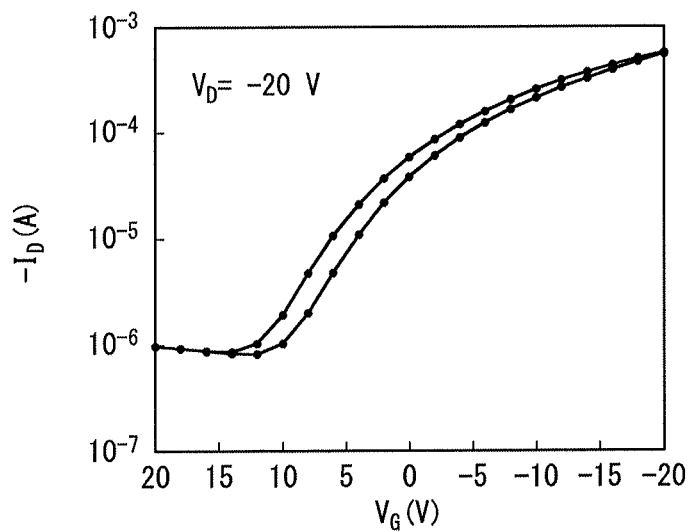
FIG. 21B is a graph illustrating an evaluation result of the transistor of Example 7.
Figure 21C:
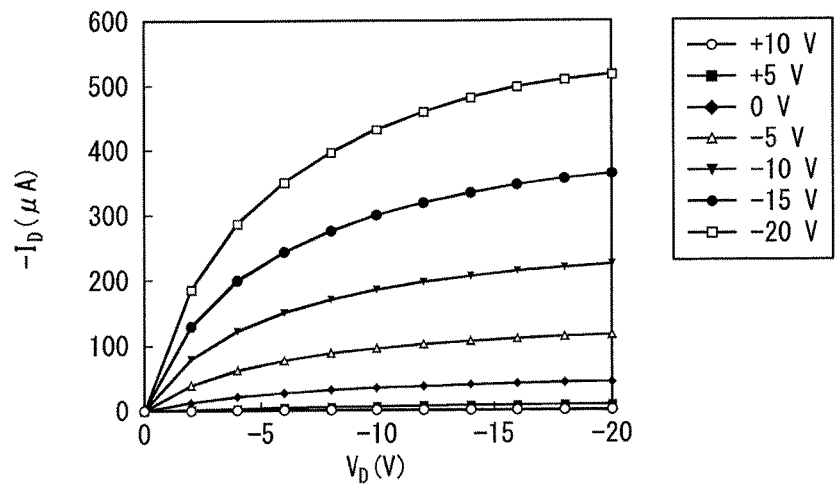
FIG. 21C is a graph illustrating an evaluation result of the transistor of Example 7.
Figure 22:
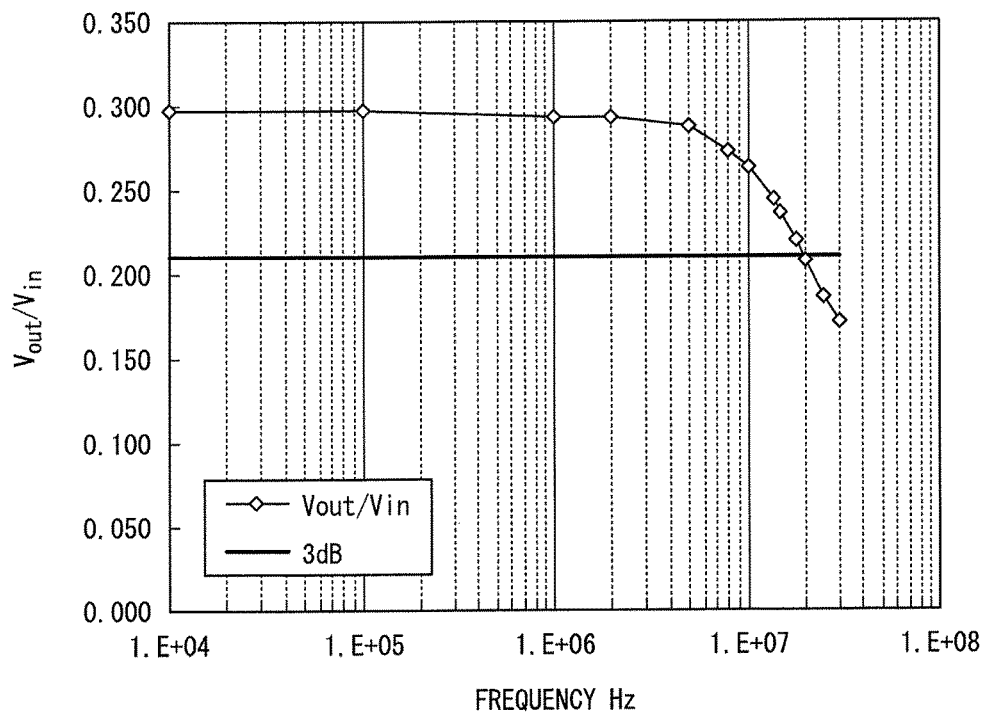
FIG. 22 is a graph for obtaining the maximum frequency at the time of performing rectification in the circuit manufactured by using the transistor of Example 7.

Then, the same evaluation as that in Example 4 was performed with respect to the obtained transistor. The results are shown in Table 3. In addition, at this time, graphs of a relationship between the drain current ID and the gate voltage VG and a relationship between the drain current ID and the drain voltage VD (output properties) are illustrated in FIG. 21A to FIG. 21C. FIG. 21A illustrates a relationship between ID and VG in the linear region ($V_D=-1$ V), FIG. 21B illustrates a relationship between ID and VG in the saturated region (VD=−20 V), and FIG. 21C illustrates a relationship between ID and VD, respectively. In addition, a graph obtained when the maximum frequency at the time of performing rectification is obtained is illustrated in FIG. 22.

INDUSTRIAL APPLICABILITY

The present invention can be used in an electronic circuit of a computer, an IC of a TFT, or the like.

REFERENCE SIGNS LIST 1, 2, 3: TRANSISTOR
11: SUBSTRATE
12, 32: GATE ELECTRODE
13, 33: INSULATING LAYER
14, 24: SEMICONDUCTOR LAYER
15, 25: SOURCE ELECTRODE
16, 26: DRAIN ELECTRODE
17: MODIFICATION LAYER
18, 28: INTERMEDIATE LAYER
L: CHANNEL LENGTH
W: CHANNEL WIDTH

The invention claimed is:
1. A transistor comprising a gate electrode, an insulating layer, a semiconductor layer, a source electrode, and a drain electrode on a substrate,
  wherein the gate electrode comprises silver 2-methyl acetoacetate,

TABLE 3

| | Gate Electrode | | Insulating Layer Material | Transistor | | | | | |
|---|---|---|---|---|---|---|---|---|---|
| | | | | Channel | Mobility of Carrier ($cm^2$/Vs) | | Threshold Voltage (V) | OFF Current (A) | Current ON/OFF Ratio (logA) | Maximum Frequency at the Time of Performing Rectification |
| | Formation Method | Thickness (nm) | Ra (nm) | (Thickness (nm)) | Length (μm) | Linear Region | Linear Region | | | | |
| Example 4 | Application of Sliver Ink Composition | 100 | 4 | Olefin (400) | 5 | 1.8 | 0.6 | 5 | $1 \times 10^{-6}$ | 3 | 6.5 |
| Example 5 | Application of Sliver Ink Composition | 200 | 4 | Alumina (130)/ Olefin (30) | 5 | 0.7 | 1.0 | 3 | $1 \times 10^{-4}$ | 2 | 10.0 |
| Example 6 | Application of Sliver Ink Composition | 200 | 4 | Alumina (130)/ Olefin (30) | 2 | 0.3 | 0.2 | 3 | $1 \times 10^{-5}$ | 2 | 18.0 |
| Example 7 | Application of Sliver Ink Composition | 40 | — | Olefin (400) | 2 | 1.5 | 0.3 | −2 | $1 \times 10^{-3}$ | 3 | 20.0 |

As it is obvious from Table 3, as with the transistors of Examples 1 to 3, in the transistors of Examples 4 to 7, the surface roughness of the gate electrode which was formed by using the silver β-ketocarboxylate (1) under atmosphere by a coating method was low, and the mobility of the carrier was high. In addition, the threshold voltage was in a suitable numerical range, the OFF current was low was low, and the current ON/OFF ratio was large. Further, as illustrated in FIG. 14A to FIG. 14C, FIG. 17A to FIG. 17C, FIG. 19A to FIG. 19C, and FIG. 21A to FIG. 21C, all of $I_D$ and $V_G$, and $I_D$ and $V_D$ had a clear mutual relationship. Thus, the transistors of Examples 4 to 7 had excellent properties.

Further, the transistors of Examples 4 to 7 had a short channel length, were advantageous to be operated at a high frequency, and had higher utility, and these properties were confirmed by the fact that all of the maximum frequencies at the time of performing rectification were large.

wherein a mobility of the carrier in a linear region is greater than or equal to 4.7 $cm^2$/Vs, and the mobility of the carrier in a saturated region is greater than or equal to 4.0 $cm^2$/Vs,
  wherein a current ON/OFF ratio (log A) of the transistor is 2.0 or more, and 6.0 or less,
  wherein the semiconductor layer is an organic semiconductor,
  when a threshold voltage of the transistor is 0 V or more and 10 V or less, the transistor is operated on a gate voltage with the −30 V to the threshold voltage, and
  when a threshold voltage of the transistor is −2 V or more and lower than 0 V, the transistor is operated on a gate voltage with the −20 V to the threshold voltage.
2. The transistor according to claim 1,
  wherein the transistor has a bottom gate and bottom contact type structure or a bottom gate and top contact type structure.

3. The transistor according to claim 1,
wherein surface roughness of the gate electrode based on "ISO4287:1997" is 1 nm to 10 nm.

4. The transistor according to claim 1,
wherein a thickness of the gate electrode is 10 nm to 1000 nm, and a thickness of the insulating layer is 10 nm to 1000 nm.

* * * * *